United States Patent
Yamada et al.

(10) Patent No.: US 6,787,913 B2
(45) Date of Patent: Sep. 7, 2004

(54) OHMIC CONTACT PLUG HAVING AN IMPROVED CRACK FREE TIN BARRIER METAL IN A CONTACT HOLE AND METHOD OF FORMING THE SAME

(75) Inventors: Yoshiaki Yamada, Tokyo (JP); Takashi Yokoyama, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 396 days.

(21) Appl. No.: 09/974,808

(22) Filed: Oct. 12, 2001

(65) Prior Publication Data

US 2002/0020922 A1 Feb. 21, 2002

Related U.S. Application Data

(62) Division of application No. 09/197,682, filed on Nov. 23, 1998.

(30) Foreign Application Priority Data

Nov. 21, 1997 (JP) .............................................. 9-337708

(51) Int. Cl.[7] .......................... H01L 23/48; H01L 23/52; H01L 29/40
(52) U.S. Cl. .......................... 257/763; 257/774; 257/775
(58) Field of Search ................................. 257/763, 774, 257/775

(56) References Cited

U.S. PATENT DOCUMENTS

| 5,244,820 | A | * | 9/1993 | Kamata et al. ............. 438/514 |
| 5,672,543 | A | * | 9/1997 | Chang et al. ............... 438/653 |
| 5,747,384 | A | * | 5/1998 | Miyamoto ................. 438/685 |
| 5,985,756 | A | | 11/1999 | Shinmura .................... 438/648 |
| 6,046,100 | A | | 4/2000 | Ramaswami et al. ....... 438/624 |
| 6,059,872 | A | | 5/2000 | Ngan et al. ............... 106/296.8 |
| 6,077,782 | A | | 6/2000 | Hsu et al. .................... 438/688 |

FOREIGN PATENT DOCUMENTS

| JP | 63111665 | 5/1988 |
| JP | 193117 | 4/1989 |
| JP | 4196486 | 7/1992 |
| JP | 778789 | 3/1995 |
| JP | 7161662 | 6/1995 |
| JP | 7245300 | 9/1995 |
| JP | 878520 | 3/1996 |
| JP | 8181212 | 7/1996 |
| JP | 9228042 | 9/1997 |
| JP | 1065004 | 3/1998 |

OTHER PUBLICATIONS

J.P. Seidel, et al., "Integrated deposition of TiN barrier layers in cluster tools", Proc. of the SPIE, vol. 1549, pp. 30–40. (abstract).

H.J. Barth, et al. "TEM analysis of the spiking mechanism in Al–filled contacts", Advanced Metallization and Interconnect Systems for ULSI Appplications in 1996, pp. 305–311. (abstract).

D.H. Lee, et al. "Characteristics of CMOSFETs with sputter–deposited W/TiN stack gate" 1995 Symp. on VLSI Tech. Digest of tech. Papers, IEEE and JSAP pp. 119–120.

(List continued on next page.)

*Primary Examiner*—William M. Brewster
(74) *Attorney, Agent, or Firm*—Young & Thompson

(57) ABSTRACT

A sputtering method of depositing a titanium nitride film on a titanium film in contact with a silicon at a bottom of a contact hole is provided, wherein the sputtering method is carried out at a temperature of the silicon region of not less than 450° C., so that the titanium nitride film has a compressive stress of not higher than $5 \times 10^9$ dyne/cm$^2$ whereby the titanium film has such a high stability as preventing any crack upon changing the compressive stress to a tensile stress by a heat treatment.

8 Claims, 12 Drawing Sheets

OTHER PUBLICATIONS

S.-L. Zhang, et al. "Influenece of hydrogen on chemical vapor deposited W on sputter–deposited TiN" Applied Physics Lett., vol. 67, No. 20, pp. 2998–3000.

J. van Gogh et al., Characterization of improved TiN films by controlled divergence sputtering, pp. 310–313, ISMIC, vol. 101, No. 92, VMIC Conference, Jun. 9–10, 1992.

A. Mouroux, et al. "Impact of rapid thermal annealing of Ti–TiN bilayers on subsequent chemical vapor deposition", Advanced Metallization for Future ULSI. Symp., pp. 365–370. (abstract).

* cited by examiner

OHMIC CONTACT PLUG HAVING AN IMPROVED CRACK FREE TIN BARRIER METAL IN A CONTACT HOLE AND METHOD OF FORMING THE SAME

This application is a division of co-pending application Ser. No. 09/197,682, filed on Nov. 23, 1998, which application was refiled as a continuation prosecution application on Aug. 24, 2000, the entire contents of which are hereby incorporated by reference.

BACKGROUND OF THE INVENTION

The present invention relates to a semiconductor device and a method of forming the same, and more particularly to an improved contact plug having an ohmic contact with a silicon substrate and a method of forming the same.

As the advanced large scale integrated circuits have been developed to further increase the density of integratio, the requirement for size down of a contact plug has been on the increase, wherein the contact plug is provided in a contact hole formed in an inter-layer insulator over a silicon substrate so that an interconnection extending over the inter-layer insulator is electrically connected through the contact plug in the contact hole to a semiconductor device formed in an upper region of the silicon substrate. A thickness of the inter-layer insulator is not reduced despite scaling down of the semiconductor device and despite the increase in density of the integratio of the large scale integrated circuits. This means that the depth of the contact hole or the height of the contact plug is also not reduced. Notwithstanding, a diameter or a horizontal size of the contact hole or the contact plug is reduced upon scaling down of the semiconductor device and also upon the increase in density of the integratio of the large scale integrated circuits. An aspect ratio of the contact hole is defined to be a ratio of a depth of the contact hole to a diameter of the contact hole, wherein the depth of the contact hole corresponds to a thickness of the inter-layer insulator in which the contact hole is formed. The recent further increased requirement for scaling down of the semiconductor device and increase in the density of integratio of the large scale integrated circuit results in an increase in the aspect ratio of the contact hole. This increase in the aspect ratio of the contact hole makes it difficult to reduce a resistance of the contact plug in the contact hole. In general, in order to obtain a possible ohmic contact of the contact plug with a silicon substrate of both type, namely n-type and p-type, a thin titanium film is deposited on a bottom and a side wall of the contact hole prior to a further deposition of a thin titanium nitride film as a barrier metal on the thin titanium film to form laminations of the titanium film and the titanium nitride film, before a tungsten film is deposited by a chemical vapor deposition on the titanium nitride film as the barrier metal so as to deposit the tungsten film within the contact hole, whereby a contact plug is then formed in the contact plug, wherein the contact plug comprises the tungsten film and the laminations of the titanium nitride film and the titanium film. The tungsten film deposited by the chemical vapor deposition has a good contact coverage. It is required that each of the titanium film and the titanium nitride film has a thickness of not less than 10 nanometers on the bottom of the contact hole. If the thickness of the titanium film on the bottom of the contact hole is less than 10 nanometers, then a contact resistance of the plug with the silicon substrate is high. If the thickness of the titanium nitride film on the bottom of the contact hole is less than 10 nanometer, this extremely thin titanium nitride film is incapable of exhibiting a barrier property to tungsten hexafluoride as a source gas for carrying out the chemical vapor deposition to deposit the tungsten film, thereby allowing tungsten hexa-fluoride to be reacted with titanium nitride of the titanium nitride film and titanium of the titanium film, resulting in an increase in the contact resistance of the contact plug and a possible breaking of the p-n junction.

In the advanced semiconductor devices such as 64 Mb-DRAM, the aspect ratio of the contact hole exceeds 4. In this case, it is difficult to apply or use the normal sputtering method to deposit the titanium film or the titanium nitride film, both of which have a thickness of not less than 10 nanometers. In order to obtain a good contact coverage, it is required that sputtered particles fall in a direction just or almost vertical to a surface of the substrate or in a parallel direction to the vertical side wall of the contact hole. In order to respond to this requirements, a collimated sputtering method and a long distance sputtering method are available.

The collimated sputtering method is carried out by using a collimator plate between a target to be sputtered and a substrate on which sputtered particles are deposited, wherein the collimator plate has many openings through which sputtered particles pass. Only when the sputtered particles fall in the direction just or almost vertical to the surface of the substrate, then the sputtered particles are allowed to pass through the collimator plate. Otherwise, the sputtered particles are captured by the collimator plate. For those reasons, only the sputtered particles, which fall in the direction just or almost vertical to the surface of the substrate, will be deposited on the surface of the substrate or on the bottom of the contact hole having the high aspect ratio. This technique is, for example, disclosed in Japanese laid-open patent publication No. 5-299375.

The long distance sputtering method is carried out by setting such a large distance between a target and a substrate that only sputtered particles, which fall in the direction just or almost vertical to the surface of the substrate, can reach on the surface of the substrate, whilst other sputtered particles having a lateral velocity component will be captured by shielding plates.

It was also known in the art to which the present invention pertains that after the titanium film and the titanium nitride film have been deposited, then a heat treatment is carried out in a nitrogen atmosphere to cause a silicidation reaction of titanium with silicon on an interface between the titanium film and the silicon substrate, so that a titanium silicide film is formed on the interface of the silicon substrate with the titanium film, whereby a contact resistance between the plug and the silicon substrate is reduced. This heat treatment can concurrently cause a nitration reaction of unreacted titanium with nitrogen in the titanium nitride film, thereby increasing the barrier capability of the titanium nitride film as a barrier metal. This heat treatment may be carried out by using a furnace as disclosed in the above mentioned Japanese laid-open patent publication No. 5-299275 or by use of a lamp anneal system for rapid anneal in a short time and this lamp anneal system is suitable for a large size substrate.

The following descriptions will be directed to a conventional method of forming the contact plug in the contact hole of the high aspect ratio, wherein the collimated sputtering method is utilized.

Semiconductor devices are formed in a silicon substrate. A boro-phospho-silicate glass film as an inter-layer insulator is deposited by a chemical vapor deposition method on a surface of the silicon substrate. A contact hole is formed in the inter-layer insulator by use of a photo-lithography and a subsequent dry etching process so that the contact hole reaches a surface of the silicon substrate, whereby a part of the surface of the silicon substrate is exposed through the contact hole. The contact hole has a diameter of not larger than 0.35 micrometers.

The collimator sputtering method is carried out to deposit a titanium film on the top surface of the inter-layer insulator and on vertical side walls and a bottom of the contact hole, wherein the titanium film has a thickness in the range of 50–100 nanometers. Subsequently, a titanium nitride film is then deposited by the collimator sputtering method on the titanium film, wherein the titanium nitride film has a thickness in the range of 80–150 nanometers. This collimator sputtering method is carried out by use of a collimator plate which has an aspect ratio of 1.5, wherein the aspect ratio is defined to a ratio of a thickness of the collimator plate to a diameter of openings. The first collimator sputtering process for depositing the above titanium film is carried out by sputtering a titanium target with argon gas under a pressure in the range of 0.5–3.0 mTorr at a substrate temperature in the range of about 150–400° C. The second collimator sputtering process for depositing the above titanium nitride film is carried out by sputtering a titanium nitride target with a nitrogen-argon mixture gas or a nitrogen gas under a pressure in the range of 1.5–5.0 mTorr at a substrate temperature in the range of about 150–400° C.

Subsequently, a lamp anneal is carried out in a nitrogen atmosphere at a temperature in the range of 650–720° C. for 10–60 seconds, whereby a titanium silicidation reaction of titanium in the titanium film with silicon in the silicon substrate is cased to form a titanium silicide film on an interface between the titanium film and the silicon substrate, thereby reducing a contact resistance of the titanium film with the silicon substrate. This lamp anneal further causes a nitratio reaction of unreacted titanium with nitrogen in the titanium nitride film thereby increasing a barrier property of the titanium nitride film.

A low pressure chemical vapor deposition method is carried out by reducing tungsten hexafluoride with hydrogen to deposit a tungsten film on the titanium nitride film so that the tungsten film has a thickness in the range of 400–600 nanometers. The surface of the CVD-deposited tungsten film is then subjected to an etch-back process with use of sulfur hexafluoride to etch the CVD-deposited tungsten film except within the contact hole, whereby a tungsten contact plug is formed in the contact hole.

An aluminum alloy film is deposited by a sputtering method on the titanium nitride film and over the inter-layer insulator and on the top of the contact plug in the contact hole. Further, a titanium nitride film is deposited by a subsequent sputtering method on the aluminum alloy film to form laminations of the aluminum alloy film and the titanium nitride film. The laminations of the aluminum alloy film and the titanium nitride film are then patterned by a photo-lithography and a subsequent dry etching process thereby to form an interconnection over the inter-layer insulator, wherein the interconnection is in contact with the top of the contact plug in the contact hole so that the interconnection is electrically connected through the contact plug in the contact hole to the semiconductor device in the surface of the silicon substrate.

The titanium nitride film as the barrier metal deposited by the collimated sputtering method has a large compressive stress of, for example, not less than $1 \times 10^{10}$ dyne/cm$^2$ as compared to the titanium nitride film deposited by the normal sputtering method. This has already reported in 1992, VLSI Multilevel Interconnection Conference, pp. 310–313 "Characterization Of Improved TiN films By Controlled Divergence Sputtering".

If the barrier metal film has a large compressive stress, then a p-n junction property or characterization is deteriorated by a heat treatment, for which reason it is preferable that the compressive stress of the barrier metal film is suppressed at not higher than $5 \times 10^9$ dyne/cm$^2$. This is, for example, disclosed in Japanese laid-open patent publication No. 63-111665.

The large compressive stress of the barrier metal may cause other problems with appearance of peeling or cracking the titanium nitride film during the later heat treatment. This is, for example, disclosed in Japanese laid-open patent publication No. 2-133964. Particularly when the rapid heat treatment is carried out, then the cracking is likely to appear. The reason why the cracking appears in the titanium nitride film as the barrier metal film is that carrying out a heat treatment to the titanium nitride film as the barrier metal film having such the large compressive stress causes an increase in density of the titanium nitride film to change the large compressive stress into a large tensile stress which may be capable of cracking the titanium nitride film. Particularly rapid thermal anneal such as the lamp anneal to the titanium nitride film as the barrier metal film having such the large compressive stress causes a rapid increase in density of the titanium nitride film to rapidly change the large compressive stress into a large tensile stress, whereby a rapid plastic deformation appears to crack the titanium nitride film.

FIG. 1 is a fragmentary and enlarged cross sectional elevation view illustrative of a bottom portion of a contact hole in an inter-layer insulator and over a titanium nitride film in an upper region of a silicon substrate after a heat treatment has been carried out to cause a silicidation reaction for forming the titanium silicide film. A boro-phospho-silicate glass film 2 as an inter-layer insulator is formed on a silicon substrate 1. A contact hole having a high aspect ratio is formed in the inter-layer insulator 2 by use of a photo-lithography and a subsequent dry etching process so that the contact hole reaches onto a surface of the silicon substrate. A titanium film 3 is deposited on the bottom and the side walls of the contact hole and on a surface of the inter-layer insulator by a sputtering method, for example, a collimator sputtering method for obtaining a good step overage of the titanium film 3. Subsequently, a titanium nitride film 4 is then deposited on the titanium film 3 by a further sputtering method, for example, a collimator sputtering method for obtaining a good step overage of the titanium film 3. In order to reduce a contact resistance of the titanium film 3 with the silicon substrate 1, a heat treatment, for example, a rapid thermal anneal such as a lamp anneal is carried out in an inert gas atmosphere such as a nitrogen gas atmosphere so as to cause a silicidation reaction of titanium with silicon on an interface between the titanium film 3 and the silicon substrate 1, so that a titanium silicide film 5 is formed on the interface of the silicon substrate 1 with the titanium film 3, whereby a contact resistance between the titanium film 3 and the silicon substrate 1 is reduced. Concurrently, a nitration reaction of unreacted titanium with nitrogen in the titanium nitride film 4 is caused, thereby increasing the barrier capability of the titanium nitride film 4 as a barrier metal film. The heat treatment to the titanium nitride film 4 as the barrier metal film causes an increase in density of the titanium nitride film 4, thereby to change the compressive stress of the titanium nitride film 4 into a tensile stress which forms a crack at a corner of the titanium nitride film 4. The crack is likely to appear at the corners of the titanium nitride film 4. Once the cracking appears in the titanium nitride film 4, then tungsten hexafluoride gas used for a subsequent chemical vapor deposition to deposit a tungsten film to bury the contact hole with the tungsten film enters into the crack in the titanium nitride film 4 so that tungsten hexafluoride may be reacted with titanium in the titanium film 3 or silicon in the silicon substrate 1, whereby a contact resistance at the bottom of the contact hole is increased and also a p-n junction may be broken.

As described above, a likelihood of appearance of the crack in the titanium nitride film 4 largely depends upon a magnitude of a compressive stress of the titanium nitride film 4 before the heat treatment. In Japanese laid-open patent publication No. 2-133964, it is disclosed to add carbon into the titanium nitride film in order to reduce the compressive stress of the titanium nitride film. It is, actually, however, difficult to practice this method because of both a difficulty in controllability of addition of carbon into the titanium nitride film and also etching remainders are likely to appear.

The above problems with the titanium nitride film are also raised not only when the collimator sputtering method is applied to deposit the titanium nitride film but also when the other sputtering methods including the long distance sputtering method and the normal sputtering method are applied to the deposition of the titanium nitride film. Namely, the compressive stress of the titanium nitride film is changed by the heat treatment into the tensile stress which causes a crack in the titanium nitride film. Particularly, when the temperature rising rate of the heat treatment is not less than 100° C./min, then the crack is likely to appear in the titanium nitride film. The titanium nitride film deposited by the long distance sputtering method has a large compressive stress of, for example, not less than $1 \times 10^{10}$ dyne/cm$^2$ as compared to the titanium nitride film deposited by the normal sputtering method. This large compressive stress of the titanium nitride film is changed by the heat treatment into a large tensile stress which has a larger capability of causing a crack in the titanium nitride film.

In the above circumstances, it had been required to develop a novel sputtering method of depositing laminations of a titanium film and a titanium nitride film on a bottom of a contact hole having a high aspect ratio so that the titanium nitride film has a reduced compressive stress for allowing the deposited titanium nitride film to be free from any cracking during a subsequent rapid heat treatment to form a titanium silicide film on an interface between the titanium nitride film and the silicon substrate surface, thereby decreasing a contact resistance at a bottom of the contact hole.

SUMMARY OF THE INVENTION

Accordingly, it is an object of the present invention to provide a novel sputtering method free from the above problems.

It is a further object of the present invention to provide a novel sputtering method of depositing laminations of a titanium film and a titanium nitride film on a bottom of a contact hole so that the titanium nitride film has a reduced compressive stress for allowing the deposited titanium nitride film to be free from any cracking during a subsequent heat treatment to form a titanium silicide film on an interface between the titanium nitride film and the silicon substrate surface, thereby decreasing a contact resistance at a bottom of the contact hole.

It is a still further object of the present invention to provide a novel collimator sputtering method of depositing laminations of a titanium film and a titanium nitride film with a good contact coverage on a bottom of a contact hole having a high aspect ratio so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

It is yet a further object of the present invention to provide a novel long distance sputtering method of depositing laminations of a titanium film and a titanium nitride film with a good contact coverage on a bottom of a contact hole having a high aspect ratio so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

It is a further more object of the present invention to provide a novel method of forming a contact plug in a contact hole free from the above problems.

It is still further object of the present invention to provide a novel method of forming a contact plug in a contact hole by a novel sputtering method of depositing laminations of a titanium film and a titanium nitride film on a bottom of a contact hole so that the titanium nitride film has a reduced compressive stress for allowing the deposited titanium nitride film to be free from any cracking during a subsequent heat treatment to form a titanium silicide film on an interface between the titanium nitride film and the silicon substrate surface, thereby decreasing a contact resistance at a bottom of the contact hole.

It is moreover object of the present invention to provide a novel method of forming a contact plug in a contact hole by a novel collimator sputtering method of depositing laminations of a titanium film and a titanium nitride film with a good contact coverage on a bottom of a contact hole having a high aspect ratio so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

It is another object of the present invention to provide a novel method of forming a contact plug in a contact hole by a novel long distance sputtering method of depositing laminations of a titanium film and a titanium nitride film with a good contact coverage on a bottom of a contact hole having a high aspect ratio so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

It is still another object of the present invention to provide a novel titanium nitride film deposited by a novel sputtering method on a titanium film so that the titanium nitride film has a reduced compressive stress free from the above problems.

It is yet another object of the present invention to provide a novel titanium nitride film deposited by a novel sputtering method on a titanium film on a silicon substrate so that the titanium nitride film has a reduced compressive stress for allowing the deposited titanium nitride film to be free from any cracking during a subsequent heat treatment to form a titanium silicide film on an interface between the titanium nitride film and the silicon substrate surface, thereby decreasing a contact resistance at a bottom of the contact hole.

It is further another object of the present invention to provide a novel titanium nitride film deposited by a novel collimator sputtering method on a titanium film on a silicon substrate so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

It is an additional object of the present invention to provide a novel titanium nitride film deposited by a novel long distance sputtering method on a titanium film on a silicon substrate so that the titanium nitride film has a reduced compressive stress for allowing the deposited titanium nitride film to be free from any cracking during a subsequent rapid thermal anneal such as a lamp anneal to form a titanium silicide film on an interface between the titanium nitride film and the silicon substrate surface, thereby decreasing a contact resistance at a bottom of the high aspect ratio contact hole.

In a first aspect, the invention provides a multilayer structure on a bottom of a contact hole, the multilayer structure comprising a titanium film on a silicon region and a titanium nitride film on the titanium film, wherein the titanium nitride film has a compressive stress of not higher than $5 \times 10^9$ dyne/cm$^2$ so that the titanium film has such a high stability as preventing any crack upon changing the compressive stress to a tensile stress by a heat treatment.

In a second aspect, the invention provides a contact plug structure in a contact hole in an inter-layer insulator on a silicon substrate. The contact plug structure comprises: a titanium film on a bottom and a side wall of the contact hole; a titanium nitride film on the titanium film; a metal plug on the titanium nitride film so that the metal plug buries the contact hole; and a titanium silicide layer in a surface region of the silicon substrate and in contact with a bottom of the contact hole, wherein the titanium nitride film free of any crack and has a tensile stress of not higher than $3 \times 10^9$ dyne/cm$^2$.

In a third aspect, the invention provides a sputtering method of depositing a titanium nitride film on a titanium film in contact with a silicon at a bottom of a contact hole, wherein the sputtering method is carried out at a temperature of the silicon region of not less than 450° C., so that the titanium nitride film has a compressive stress of not higher than $5 \times 10^9$ dyne/cm$^2$ whereby the titanium film has such a high stability as preventing any crack upon changing the compressive stress to a tensile stress by a heat treatment.

In a fourth aspect, the invention provides a method of forming a multilayer structure on a bottom of a contact hole. The method comprises the steps of: carrying out a first sputtering method to deposit a titanium film on the bottom of the contact hole so that the titanium film is in contact with a silicon region; carrying out a sputtering method to deposit a titanium nitride film on the titanium film; carrying out a heat treatment for causing a silicidation reaction of titanium with silicon to form a titanium silicide film on an interface between the titanium film and the silicon region, wherein the sputtering method is carried out at a temperature of the silicon region of not less than 450° C., so that the titanium nitride film has a compressive stress of not higher than $5 \times 10^9$ dyne/cm$^2$, so that the titanium nitride film is free of any crack upon changing the compressive stress to a tensile stress by the heat treatment.

In a fifth aspect, the invention provides a method of forming a contact plug in a contact hole formed in an inter-layer insulator on a silicon substrate. The method comprises the steps of: carrying out a first sputtering method to deposit a titanium film on the bottom of the contact hole so that the titanium film is in contact with a silicon region; carrying out a sputtering method to deposit a titanium nitride film on the titanium film; carrying out a heat treatment for causing a silicidation reaction of titanium with silicon to form a titanium silicide film on an interface between the titanium film and the silicon region; and forming a metal plug on the titanium nitride film to bury the contact hole with the metal plug, thereby forming the contact plug in the contact hole, wherein the sputtering method is carried out at a temperature of the silicon region of not less than 450° C., so that the titanium nitride film has a compressive stress of not higher than $5 \times 10^9$ dyne/cm$^2$, so that the titanium nitride film is free of any crack upon changing the compressive stress to a tensile stress by the heat treatment.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
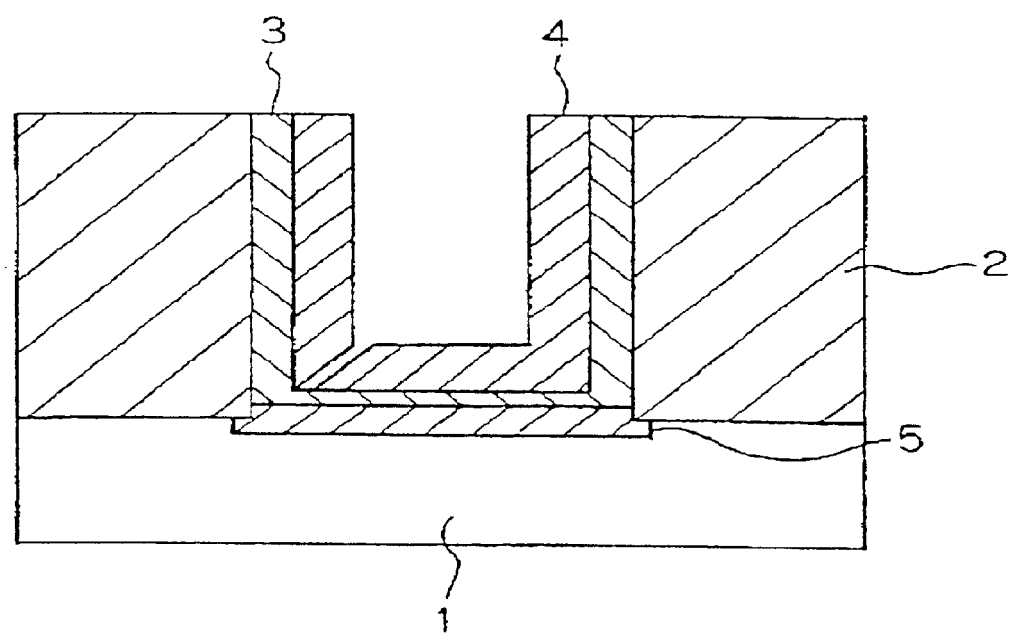
FIG. 1 is a fragmentary and enlarged cross sectional elevation view illustrative of a bottom portion of a contact hole in an inter-layer insulator and over a titanium nitride film in an upper region of a silicon substrate after a heat treatment has been carried out to cause a silicidation reaction for forming the titanium silicide film.

The invention provides a multilayer structure on a bottom of a contact hole, the multilayer structure comprising a titanium film on a silicon region and a titanium nitride film on the titanium film, wherein the titanium nitride film has a compressive stress of not higher than $5 \times 10^9$ dyne/cm$^2$ so that the titanium film has such a high stability as to prevent any crack upon changing the compressive stress to a tensile stress by a heat treatment.

It is preferable that the compressive stress of the titanium nitride film is not higher than $3 \times 10^9$ dyne/cm$^2$.

It is also preferable that the titanium nitride film is mainly oriented in a (200)-face.

It is also preferable that the contact hole has an aspect ratio of not less than 4. It is further preferable that the contact hole has an aspect ratio of not less than 5.

In order to avoid any formation of the cracks such as micro cracks in the titanium nitride film during the heat treatment such as the lamp anneal, it is necessary that the titanium nitride film is deposited by the sputtering method at the substrate temperature of not less than 450° C., so that the deposited titanium nitride film has the low compressive stress of not more than about $5 \times 10^9$ dyne/cm$^2$, whereby the low compressive stress of not more than about $5 \times 10^9$ dyne/cm$^2$ is changed by the heat treatment such as the lamp anneal into the low tensile stress of more than about $3 \times 10^9$ dyne/cm$^2$, resulting in no crack nor micro crack being formed throughout the titanium nitride film.

It is particularly preferable that the titanium nitride film is deposited by the sputtering method at the substrate temperature of not less than 500° C., so that the deposited titanium nitride film has the low compressive stress of not more than about $1 \times 10^9$ dyne/cm$^2$, whereby the low compressive stress of not more than about $1 \times 10^9$ dyne/cm$^2$ is changed by the heat treatment such as the lamp anneal into the low tensile stress of more than about $7 \times 10^8$ dyne/cm$^2$, resulting in no crack nor micro crack being formed throughout the titanium nitride film.

In order to obtain the titanium nitride film mainly oriented in (200)-face which improves the barrier property of the titanium nitride film, it is required that the substrate temperature is not less than 450° C. under the low pressure of, for example, 3 mTorr if the collimator sputtering method is carried out. In order to obtain the titanium nitride film mostly oriented in (200)-face, it is required that the substrate temperature is not less than 500° C. under the low pressure of, for example, 3 mTorr if the collimator sputtering method is carried out.

In order to obtain the titanium nitride film mainly oriented in (200)-face, it is required that the pressure of the collimator sputtering is not more than 3 mTorr if the collimator sputtering method is carried out.

If, in accordance with the present invention, the sputtering method is carried out under a low pressure at the high substrate temperature of not less than 450° C., for example, 500° C., it is possible to reduce the compressive stress to not higher than $5 \times 10^9$ dyne/cm$^2$ of the titanium nitride film deposited by the sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

In order to obtain both the 80% high ratio in orientation of (200)-face to (111)-face for a high barrier property of the titanium nitride film and the low compressive stress of not higher than $5 \times 10^9$ dyne/cm$^2$ of the titanium nitride film for suppressing the formation of the crack in the titanium nitride film, it is necessary that the sputtering method for deposition of the titanium nitride film is carried out at the substrate temperature of not higher than 450° C. under a low pressure. If the collimator sputtering method is carried out, then the pressure is not higher than 3 mTorr.

If the long distance sputtering method is carried out to deposit the titanium film, then in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5 \times 10^9$ dyne/cm$^2$, whereby the low compressive stress of not more than about $5 \times 10^9$ dyne/cm$^2$ is changed by the heat treatment such as the lamp anneal into the low tensile stress of more than about $3 \times 10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3 \times 10^9$ dyne/cm$^2$, whereby the low compressive stress of not more than about $3 \times 10^9$ dyne/cm$^2$ is changed by the heat treatment such as the lamp anneal into the low tensile stress of more than about $2 \times 10^9$ dyne/cm$^2$, resulting in no crack nor micro crack being formed throughout the titanium nitride film.

In order to obtain both the 80% high ratio in orientation of (200)-face to (111)-face for a high barrier property of the titanium nitride film and the low compressive stress of not higher than $5 \times 10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

The second aspect of the present invention provides a contact plug structure in a contact hole in an inter-layer insulator on a silicon substrate. The contact plug structure comprises: a titanium film on a bottom and a side wall of the contact hole; a titanium nitride film on the titanium film; a metal plug on the titanium nitride film so that the metal plug buries the contact hole; and a titanium silicide layer in a surface region of the silicon substrate and in contact with a bottom of the contact hole, wherein the titanium nitride film free of any crack and has a tensile stress of not higher than $3 \times 10^9$ dyne/cm$^2$.

It is preferable that the tensile stress of the titanium nitride film is not higher than $2\times10^9$ dyne/cm$^2$.

It is also preferable that the titanium nitride film is mainly oriented in a (200)-face.

It is also preferable that the contact hole has an aspect ratio of not less than 4. It is further preferable that the contact hole has an aspect ratio of not less than 5.

In order to avoid any formation of the cracks such as micro cracks in the titanium nitride film during the heat treatment such as the lamp anneal, it is necessary that the titanium nitride film is deposited by the sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film.

It is particularly preferable that the titanium nitride film is deposited by the sputtering method at the substrate temperature of not less than 500° C., so that the deposited titanium nitride film has the low compressive stress of not more than about $1\times10^9$ dyne/cm$^2$, whereby the low compressive stress of not more than about $1\times10^9$ dyne/cm$^2$ is changed by the heat treatment such as the lamp anneal into the low tensile stress of more than about $7\times10^8$ dyne/cm$^2$, resulting in no crack nor micro crack being formed throughout the titanium nitride film.

In order to obtain the titanium nitride film mainly oriented in (200)-face which improves the barrier property of the titanium nitride film, it is required that the substrate temperature is not less than 450° C. under the low pressure of, for example, 3 mTorr if the collimator sputtering method is carried out. In order to obtain the titanium nitride film mostly oriented in (200)-face, it is required that the substrate temperature is not less than 500° C. under the low pressure of, for example, 3 mTorr if the collimator sputtering method is carried out.

In order to obtain the titanium nitride film mainly oriented in (200)-face, it is required that the pressure of the collimator sputtering is not more than 3 mTorr if the collimator sputtering method is carried out.

If, in accordance with the present invention, the sputtering method is carried out under a low pressure at the high substrate temperature of not less than 450° C., for example, 500° C., it is possible to reduce the compressive stress to not higher than $5\times10^9$ dyne/cm$^2$ of the titanium nitride film deposited by the sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the sputtering method for deposition of the titanium nitride film is carried out at the substrate temperature of not higher than 450° C. under a low pressure.

If the collimator sputtering method is carried out, then the pressure is not higher than 3 mTorr.

If the long distance sputtering method is carried out to deposit the titanium film, then in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3\times10^9$ dyne/cm$^2$, whereby the low compressive stress of not more than about $3\times10^9$ dyne/cm$^2$ is changed by the heat treatment such as the lamp anneal into the low tensile stress of more than about $2\times10^9$ dyne/cm$^2$, resulting in no crack nor micro crack being formed throughout the titanium nitride film.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

The third aspect of the present invention provides a sputtering method of depositing a titanium nitride film on a titanium film in contact with a silicon at a bottom of a contact hole, wherein the sputtering method is carried out at a temperature of the silicon region of not less than 450° C., so that the titanium nitride film has a compressive stress of not higher than $5\times10^9$ dyne/cm$^2$ whereby the titanium film has such a high stability as preventing any crack upon changing the compressive stress to a tensile stress by a heat treatment.

It is preferable that the temperature of the silicon region is not less than 500° C., so that the titanium nitride film has such a low compressive stress of not higher than $3\times10^9$ dyne/cm$^2$.

It is also preferable that the sputtering method is carried out under a pressure of not more than 3 mTorr, so that the titanium nitride film is mainly oriented in a (200)-face. It is further preferable that the sputtering method is carried out under a pressure of not more than 1 mTorr.

It is also preferable that the sputtering method is a collimator sputtering method. It is further preferable that the contact hole has an aspect ratio of not less than 4. It is furthermore preferable that the contact hole has an aspect ratio of not less than 5.

It is also preferable that the sputtering method is a long distance sputtering method. It is further preferable that the contact hole has an aspect ratio of not less than 4. It is furthermore preferable that the contact hole has an aspect ratio of not less than 5.

In order to avoid any formation of the cracks such as micro cracks in the titanium nitride film during the heat treatment such as the lamp anneal, it is necessary that the titanium nitride film is deposited by the sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film.

It is particularly preferable that the titanium nitride film is deposited by the sputtering method at the substrate temperature of not less than 500° C., so that the deposited titanium nitride film has the low compressive stress of not more than about $1\times10^9$ dyne/cm$^2$, whereby the low compressive stress of not more than about $1\times10^9$ dyne/cm$^2$ is changed by the heat treatment such as the lamp anneal into the low tensile stress of more than about $7\times10^8$ dyne/cm$^2$, resulting in no crack nor micro crack being formed throughout the titanium nitride film.

In order to obtain the titanium nitride film mainly oriented in (200)-face which improves the barrier property of the titanium nitride film, it is required that the substrate temperature is not less than 450° C. under the low pressure of, for example, 3 mTorr if the collimator sputtering method is carried out. In order to obtain the titanium nitride film mostly oriented in (200)-face, it is required that the substrate temperature is not less than 500° C. under the low pressure of, for example, 3 mTorr if the collimator sputtering method is carried out.

In order to obtain the titanium nitride film mainly oriented in (200)-face, it is required that the pressure of the collimator sputtering is not more than 3 mTorr if the collimator sputtering method is carried out.

If, in accordance with the present invention, the sputtering method is carried out under a low pressure at the high substrate temperature of not less than 450° C., for example, 500° C., it is possible to reduce the compressive stress to not higher than $5\times10^9$ dyne/cm$^2$ of the titanium nitride film deposited by the sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the sputtering method for deposition of the titanium nitride film is carried out at the substrate temperature of not higher than 450° C. under a low pressure. If the collimator sputtering method is carried out, then the pressure is not higher than 3 mTorr.

If the long distance sputtering method is carried out to deposit the titanium film, then in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3\times10^9$ dyne/cm$^2$, whereby the low compressive stress of not more than about $3\times10^9$ dyne/cm$^2$ is changed by the heat treatment such as the lamp anneal into the low tensile stress of more than about $2\times10^9$ dyne/cm$^2$, resulting in no crack nor micro crack being formed throughout the titanium nitride film.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

The fourth aspect of the present invention provides a method of forming a multilayer structure on a bottom of a contact hole. The method comprises the steps of: carrying out a first sputtering method to deposit a titanium film on the bottom of the contact hole so that the titanium film is in contact with a silicon region; carrying out a sputtering method to deposit a titanium nitride film on the titanium film; carrying out a heat treatment for causing a silicidation reaction of titanium with silicon to form a titanium silicide film on an interface between the titanium film and the silicon region, wherein the sputtering method is carried out at a temperature of the silicon region of not less than 450° C., so that the titanium nitride film has a compressive stress of not higher than $5\times10^9$ dyne/cm$^2$, so that the titanium nitride film is free of any crack upon changing the compressive stress to a tensile stress by the heat treatment.

It is preferable that the temperature of the silicon region in the sputtering method is not less than 500° C., so that the titanium nitride film has such a low compressive stress of not higher than $3\times10^9$ dyne/cm$^2$.

It is also preferable that the sputtering method is carried out under a pressure of not more than 3 mTorr, so that the titanium nitride film is mainly oriented in a (200)-face. It is further preferable that the sputtering method is carried out under a pressure of not more than 1 mTorr. It is furthermore preferable that the sputtering method is carried out under a pressure in the range of 0.4–0.7 mTorr.

It is also preferable that the sputtering method is a collimator sputtering method. It is further preferable that the contact hole has an aspect ratio of not less than 4. It is furthermore preferable that the contact hole has an aspect ratio of not less than 5.

It is also preferable that the sputtering method is a long distance sputtering method. It is further preferable that the contact hole has an aspect ratio of not less than 4. It is furthermore preferable that the contact hole has an aspect ratio of not less than 5.

It is also preferable that the heat treatment is a rapid thermal anneal. It is further preferable that the heat treatment is carried out at a temperature rising rate in the range of 50–100° C./second. It is further preferable that the heat treatment is carried out at a temperature in the range of 650–750° C. for 10–60 seconds. It is furthermore preferable that the heat treatment is carried out at a temperature of 700° C. for 30 seconds.

In order to avoid any formation of the cracks such as micro cracks in the titanium nitride film during the heat treatment such as the lamp anneal, it is necessary that the titanium nitride film is deposited by the sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film.

It is particularly preferable that the titanium nitride film is deposited by the sputtering method at the substrate temperature of not less than 500° C., so that the deposited titanium nitride film has the low compressive stress of not more than about $1\times10^9$ dyne/cm$^2$, whereby the low compressive stress of not more than about $1\times10^9$ dyne/cm$^2$ is changed by the heat treatment such as the lamp anneal into the low tensile stress of more than about $7\times10^8$ dyne/cm$^2$, resulting in no crack nor micro crack being formed throughout the titanium nitride film.

In order to obtain the titanium nitride film mainly oriented in (200)-face which improves the barrier property of the titanium nitride film, it is required that the substrate temperature is not less than 450° C. under the low pressure of, for example, 3 mTorr if the collimator sputtering method is carried out. In order to obtain the titanium nitride film mostly oriented in (200)-face, it is required that the substrate temperature is not less than 500° C. under the low pressure of, for example, 3 mTorr if the collimator sputtering method is carried out.

In order to obtain the titanium nitride film mainly oriented in (200)-face, it is required that the pressure of the collimator sputtering is not more than 3 mTorr if the collimator sputtering method is carried out.

If, in accordance with the present invention, the sputtering method is carried out under a low pressure at the high substrate temperature of not less than 450° C., for example, 500° C., it is possible to reduce the compressive stress to not higher than $5\times10^9$ dyne/cm$^2$ of the titanium nitride film deposited by the sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the sputtering method for deposition of the titanium nitride film is carried out at the substrate temperature of not higher than 450° C. under a low pressure. If the collimator sputtering method is carried out, then the pressure is not higher than 3 mTorr.

If the long distance sputtering method is carried out to deposit the titanium film, then in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3\times10^9$ dyne/cm$^2$, whereby the low compressive stress of not more than about $3\times10^9$ dyne/cm$^2$ is changed by the heat treatment such as the lamp anneal into the low tensile stress of more than about $2\times10^9$ dyne/cm$^2$, resulting in no crack nor micro crack being formed throughout the titanium nitride film.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

The fifth aspect of the present invention provides a method of forming a contact plug in a contact hole formed in an inter-layer insulator on a silicon substrate. The method comprises the steps of: carrying out a first sputtering method to deposit a titanium film on the bottom of the contact hole so that the titanium film is in contact with a silicon region; carrying out a sputtering method to deposit a titanium nitride film on the titanium film; carrying out a heat treatment for causing a silicidation reaction of titanium with silicon to form a titanium silicide film on an interface between the titanium film and the silicon region; and forming a metal plug on the titanium nitride film to bury the contact hole with the metal plug, thereby forming the contact plug in the contact hole, wherein the sputtering method is carried out at a temperature of the silicon region of not less than 450° C., so that the titanium nitride film has a compressive stress of not higher than $5\times10^9$ dyne/cm$^2$, so that the titanium nitride film is free of any crack upon changing the compressive stress to a tensile stress by the heat treatment.

It is preferable that the temperature of the silicon region in the sputtering method is not less than 500° C., so that the titanium nitride film has such a low compressive stress of not higher than $3\times10^9$ dyne/cm$^2$.

It is also preferable that the sputtering method is carried out under a pressure of not more than 3 mTorr, so that the titanium nitride film is mainly oriented in a (200)-face. It is further preferable that the sputtering method is carried out under a pressure of not more than 1 mTorr. It is furthermore preferable that the sputtering method is carried out under a pressure in the range of 0.4–0.7 mTorr.

It is also preferable that the sputtering method is a collimator sputtering method.

It is also preferable that the contact hole has an aspect ratio of not less than 4. It is further preferable that the contact hole has an aspect ratio of not less than 5.

It is also preferable that the sputtering method is a long distance sputtering method. It is further preferable that the contact hole has an aspect ratio of not less than 4. It is furthermore preferable that the contact hole has an aspect ratio of not less than 5.

It is also preferable that the heat treatment is a rapid thermal anneal. It is further preferable that the heat treatment is carried out at a temperature rising rate in the range of 50–100° C./second. It is further preferable that the heat treatment is carried out at a temperature in the range of 650–750° C. for 10–60 seconds. It is also preferable that the heat treatment is carried out at a temperature of 700° C. for 30 seconds.

In order to avoid any formation of the cracks such as micro cracks in the titanium nitride film during the heat treatment such as the lamp anneal, it is necessary that the titanium nitride film is deposited by the sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film.

It is particularly preferable that the titanium nitride film is deposited by the sputtering method at the substrate temperature of not less than 500° C., so that the deposited titanium nitride film has the low compressive stress of not more than about $1\times10^9$ dyne/cm$^2$, whereby the low compressive stress of not more than about $1\times10^9$ dyne/cm$^2$ is changed by the heat treatment such as the lamp anneal into the low tensile stress of more than about $7\times10^8$ dyne/cm$^2$, resulting in no crack nor micro crack being formed throughout the titanium nitride film.

In order to obtain the titanium nitride film mainly oriented in (200)-face which improves the barrier property of the titanium nitride film, it is required that the substrate temperature is not less than 450° C. under the low pressure of, for example, 3 mTorr if the collimator sputtering method is carried out. In order to obtain the titanium nitride film mostly oriented in (200)-face, it is required that the substrate temperature is not less than 500° C. under the low pressure of, for example, 3 mTorr if the collimator sputtering method is carried out.

In order to obtain the titanium nitride film mainly oriented in (200)-face, it is required that the pressure of the collimator sputtering is not more than 3 mTorr if the collimator sputtering method is carried out.

If, in accordance with the present invention, the sputtering method is carried out under a low pressure at the high substrate temperature of not less than 450° C., for example, 500° C., it is possible to reduce the compressive stress to not higher than $5\times10^9$ dyne/cm$^2$ of the titanium nitride film deposited by the sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the sputtering method for deposition of the titanium nitride film is carried out at the substrate temperature of not higher than 450° C. under a low pressure. If the collimator sputtering method is carried out, then the pressure is not higher than 3 mTorr.

If the long distance sputtering method is carried out to deposit the titanium film, then in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3\times10^9$ dyne/cm$^2$, whereby the low compressive stress of not more than about $3\times10^9$ dyne/cm$^2$ is changed by the heat treatment such as the lamp anneal into the low tensile stress of more than about $2\times10^9$ dyne/cm$^2$, resulting in no crack nor micro crack being formed throughout the titanium nitride film.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

Preferred Embodiments

First Embodiment:

A first embodiment according to the present invention will be described in detail with reference to FIGS. 2A through 2D which are fragmentary cross sectional elevation views illustrative of a novel method of forming an improved contact plug in a contact hole in an inter-layer insulator on a silicon substrate, wherein a bottom of the contact hole is in contact with a titanium silicide layer.

Figure 2A:
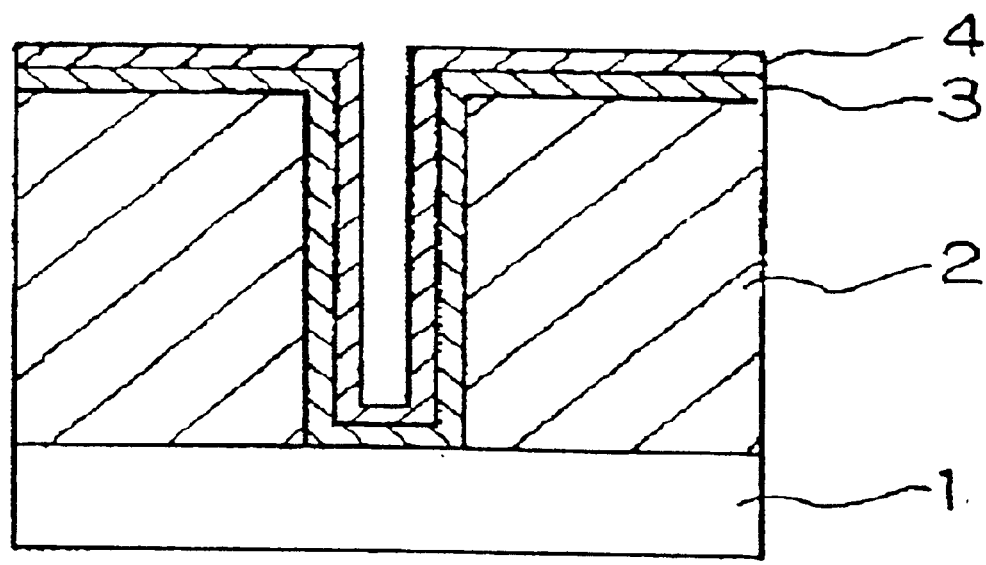
FIGS. 2A through 2D are fragmentary cross sectional elevation views illustrative of a novel method of forming an improved contact plug in a contact hole in an inter-layer insulator on a silicon substrate, wherein a bottom of the contact hole is in contact with a titanium silicide layer in a first embodiment in accordance with the present invention.
Figure 2B:
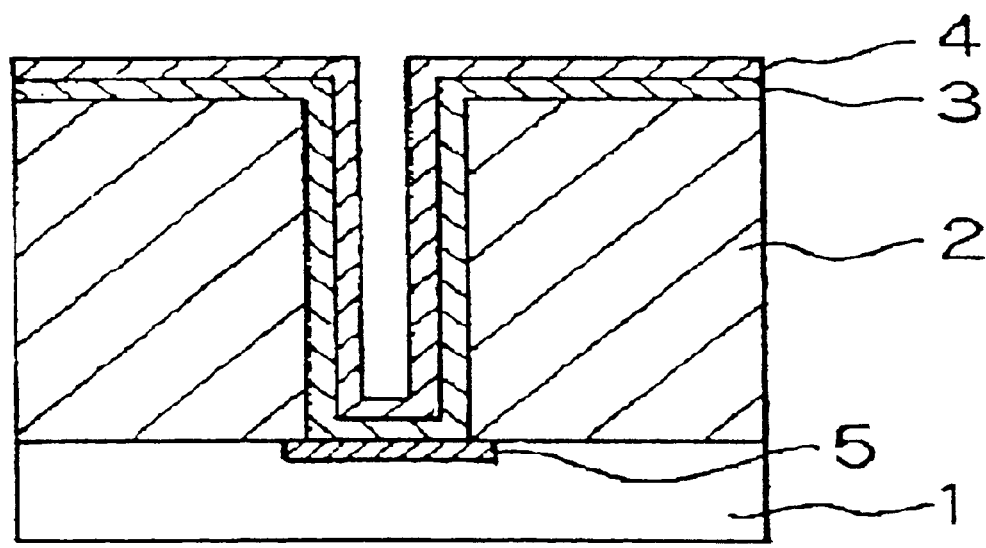

With reference to FIG. 2A, semiconductor devices are formed in a silicon substrate 1. A boro-phospho-silicate glass film 2 as an inter-layer insulator is deposited by a chemical vapor deposition method on a surface of the silicon substrate 1. A contact hole is formed in the inter-layer insulator 2 by use of a photo-lithography and a subsequent dry etching process so that the contact hole reaches a surface of the silicon substrate 1, whereby a part of the surface of the silicon substrate 1 is shown through the contact hole. The contact hole has a diameter of not larger than 0.35 micrometers.

A collimator sputtering method is carried out to deposit a titanium film 3 on the top surface of the inter-layer insulator 2 and on vertical side walls and a bottom of the contact hole, wherein the titanium film 3 has a thickness in the range of 50–100 nanometers. Subsequently, a titanium nitride film 4 is then deposited by the collimator sputtering method on the titanium film 3, wherein the titanium nitride film 4 has a thickness in the range of 80–150 nanometers. This collimator sputtering method is carried out by use of a collimator plate which has an aspect ratio of 1.5, wherein the aspect ratio is defined to a ratio of a thickness of the collimator plate to a diameter of openings. The first collimator sputtering process for depositing the above titanium film 3 is carried out by sputtering a titanium target with argon gas under a pressure in the range of 3.0 mTorr at a substrate temperature in the range of about 150–400° C. The second collimator sputtering process for depositing the above titanium nitride film 4 is carried out by sputtering a titanium nitride target with a nitrogen-argon mixture gas or a nitrogen gas under a pressure of not higher than 3.0 mTorr at a substrate temperature of not less than 450° C., for example, 500° C. A nitrogen flow rate is 80% of a total flow rate of the gases.

Subsequently, a lamp anneal is carried out in a nitrogen atmosphere at a temperature in the range of 650–720° C. for 10–60 seconds, wherein a temperature rising rate is in the range of 50–100° C./seconds, whereby a titanium silicidation reaction of titanium in the titanium film 3 with silicon in the silicon substrate 1 is cased to form a titanium silicide film 5 on an interface between the titanium film 3 and the silicon substrate 1, thereby reducing a contact resistance of the titanium film 3 with the silicon substrate 1. This lamp anneal further causes a nitration reaction of unreacted titanium with nitrogen in the titanium nitride film 4, thereby increasing a barrier property of the titanium nitride film 4.

Figure 2C:
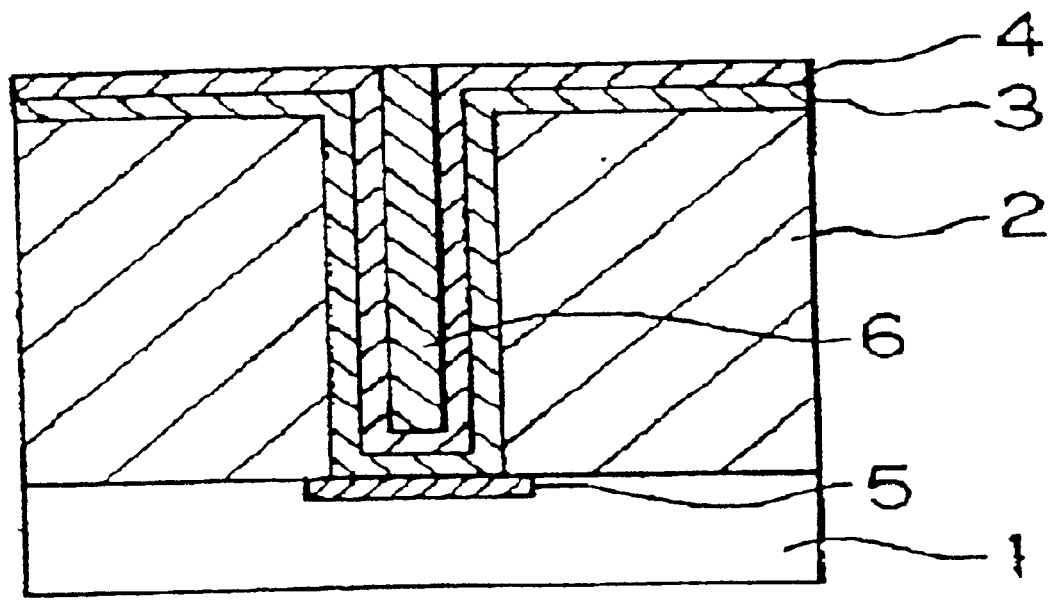

With reference to FIG. 2C, a low pressure chemical vapor deposition method is carried out by reducing tungsten hexafluoride with hydrogen to deposit a tungsten film 6 on the titanium nitride film 4 so that the tungsten film 6 has a thickness in the range of 400–600 nanometers. The surface of the CVD-deposited tungsten film 6 is then subjected to an etch-back process with use of sulfur hexafluoride to etch the CVD-deposited tungsten film 6 except within the contact hole, whereby a tungsten contact plug 6 is formed in the contact hole.

Figure 2D:
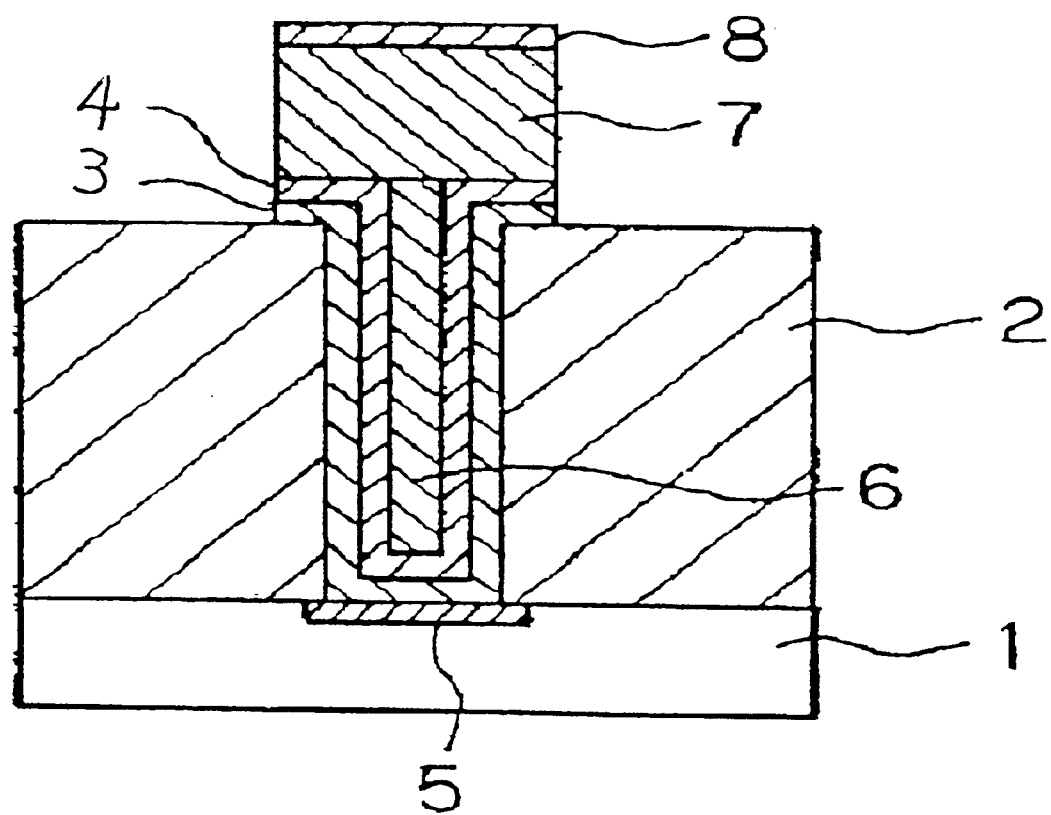

With reference to FIG. 2D, an aluminum alloy film 7 is deposited by a sputtering method on the titanium nitride film 4 and over the inter-layer insulator 2 and on the top of the contact plug in the contact hole. Further, a titanium nitride film 8 is deposited by a subsequent sputtering method on the aluminum alloy film 7 to form laminations of the aluminum alloy film 7 and the titanium nitride film 8. The laminations of the aluminum alloy film 7 and the titanium nitride film 8 are then patterned by a photo-lithography and a subsequent dry etching process thereby to form an interconnection over the inter-layer insulator 2, wherein the interconnection is in contact with the top of the contact plug in the contact hole so that the interconnection is electrically connected through the contact plug in the contact hole to the semiconductor device in the surface of the silicon substrate 1.

Figure 3:
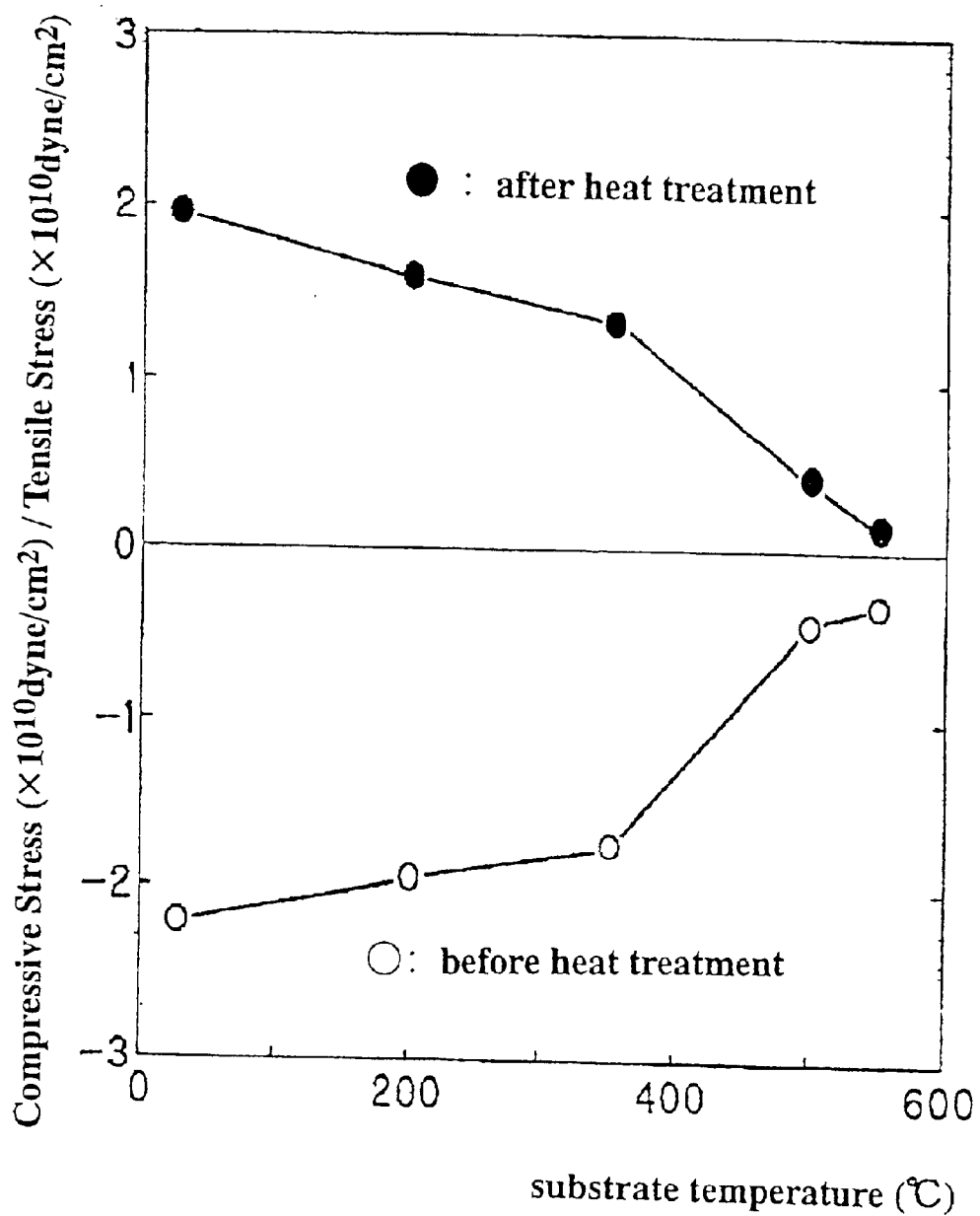
FIG. 3 is a diagram illustrative of variations in compressive and tensile stresses of a titanium nitride film deposited by a collimator sputtering method over substrate temperature of the collimator sputtering method, wherein ○ represent compressive stress whilst ● represents tensile stress in a first embodiment in accordance with the present invention.

FIG. 3 is a diagram illustrative of variations in compressive and tensile stresses of a titanium nitride film deposited by a collimator sputtering method over substrate temperature of the collimator sputtering method, wherein ○ represent compressive stress whilst ● represents tensile stress. The titanium nitride film deposited by a collimator sputtering method before the heat treatment or the lamp anneal has a compressive stress. By the heat treatment or the lamp anneal, the compressive stress of the titanium nitride film is changed into a tensile stress. The collimator sputtering method is carried out under a pressure of 3 mTorr for depositions of the titanium film having a thickness of 50 nanometers and the titanium nitride film having a thickness of 100 nanometers. The compressive and tensile stresses of the titanium nitride film were measured from a degree of bending of the titanium nitride film. The lamp anneal is carried out at a temperature of 700° C. for 30 seconds at a temperature rising rate of 100° C./seconds.

As the substrate temperature for the collimator sputtering method for deposition of the titanium nitride film is increased, then the compressive stress of the deposited titanium nitride film is also simply decreased. As the substrate temperature is increased from 50° C. to 350° C., then the compressive stress of the deposited titanium nitride film is gradually decreased. As the substrate temperature is increased from 350° C. to 500° C., then the compressive stress of the deposited titanium nitride film is rapidly decreased. When the substrate temperature is 400° C., the compressive stress of the deposited titanium nitride film is about $1 \times 10^{10}$ dyne/cm$^2$. When the substrate temperature is 450° C., the compressive stress of the deposited titanium nitride film is about $5 \times 10^9$ dyne/cm$^2$. When the substrate temperature is 500° C., the compressive stress of the deposited titanium nitride film is about $1 \times 10^9$ dyne/cm$^2$.

As the substrate temperature for the collimator sputtering method for deposition of the titanium nitride film is increased, then the tensile stress of the deposited titanium nitride film is also simply decreased. As the substrate temperature is increased from 50° C. to 350° C., then the compressive stress of the deposited titanium nitride film is gradually decreased. As the substrate temperature is increased from 350° C. to 500° C., then the tensile stress of the deposited titanium nitride film is rapidly decreased. When the substrate temperature is 400° C., the tensile stress of the deposited titanium nitride film is about $7 \times 10^9$ dyne/cm$^2$. When the substrate temperature is 450° C., the tensile stress of the deposited titanium nitride film is about $3 \times 10^9$ dyne/cm$^2$. When the substrate temperature is 500° C., the tensile stress of the deposited titanium nitride film is about $7 \times 10^8$ dyne/cm$^2$.

Consequently, as the substrate temperature for the collimator sputtering method for deposition of the titanium nitride film is increased, then a difference between the compressive stress and the tensile stress of the deposited titanium nitride film is also simply decreased. As the substrate temperature is increased from 50° C. to 350° C., then a difference between the compressive stress and the tensile stress of the deposited titanium nitride film is gradually decreased. As the substrate temperature is increased from 350° C. to 500° C., then a difference between the compressive stress and the tensile stress of the deposited titanium nitride film is rapidly decreased. When the substrate temperature is 400° C., the compressive stress of about $1 \times 10^{10}$ dyne/cm$^2$ is changed into the tensile stress of about $7 \times 10^9$ dyne/cm$^2$. When the substrate temperature is 450° C., the compressive stress of about $5 \times 10^9$ dyne/cm$^2$ is changed into the tensile stress of about $3 \times 10^9$ dyne/cm$^2$. When the substrate temperature is 500° C., the compressive stress of about $1 \times 10^9$ dyne/cm$^2$ is changed into the tensile stress of about $7 \times 10^8$ dyne/cm$^2$. A large difference between the compressive stress and the tensile stress of the titanium nitride film causes a large deformation of the titanium nitride film. This large deformation of the titanium nitride film results in a high possibility of cracking the titanium nitride film. For those reason, in order to reduce the possibility of cracking the titanium nitride film, it is necessary to realize a possible reduction in a difference between the compressive stress and the tensile stress of the titanium nitride film. By use of a four-terminal sheet resistance measuring method is applied to measure the sheet resistance. When the titanium nitride film having the compressive stress of not more than about $5 \times 10^9$ dyne/cm$^2$ is subjected to the lamp anneal at a temperature of 700° C. for 30 seconds at a temperature rising rate of 100° C./second so that the compressive stress of not more than about 5×10⁹ dyne/cm² is changed into the tensile stress of not more about 3×10⁹ dyne/cm², then no extremely high sheet resistance could be measured throughout the titanium nitride film. No crack could be observed by an electron microscope throughout the titanium nitride film after the lamp anneal was carried out. When the titanium nitride film having the compressive stress of more than about 5×10⁹ dyne/cm² is subjected to the lamp anneal at a temperature of 700° C. for 30 seconds at a temperature rising rate of 100° C./second so that the compressive stress of more than about 5×10⁹ dyne/cm² is changed into the tensile stress of more than about 3×10⁹ dyne/cm², then extremely high sheet resistance could be measured at plural points of the titanium nitride film. Micro cracks could be observed by the electron microscope at the extremely high sheet resistance points of the titanium nitride film after the lamp anneal was carried out. This shows that the micro cracks were formed by the lamp anneal.

Consequently, in order to avoid any formation of the cracks such as micro cracks in the titanium nitride film during the heat treatment such as the lamp anneal, it is necessary that the titanium nitride film is deposited by the collimator sputtering method at the substrate temperature of not less than 450° C., so that the deposited titanium nitride film has the low compressive stress of not more than about 5×10⁹ dyne/cm², whereby the low compressive stress of not more than about 5×10⁹ dyne/cm² is changed by the heat treatment such as the lamp anneal into the low tensile stress of more than about 3×10⁹ dyne/cm², resulting in no crack nor micro crack being formed throughout the titanium nitride film. It is particularly preferable that the titanium nitride film is deposited by the collimator sputtering method at the substrate temperature of not less than 500° C., so that the deposited titanium nitride film has the low compressive stress of not more than about 1×10⁹ dyne/cm², whereby the low compressive stress of not more than about 1×10⁹ dyne/cm² is changed by the heat treatment such as the lamp anneal into the low tensile stress of more than about 7×10⁸ dyne/cm², resulting in no crack nor micro crack being formed throughout the titanium nitride film.

Figure 4:
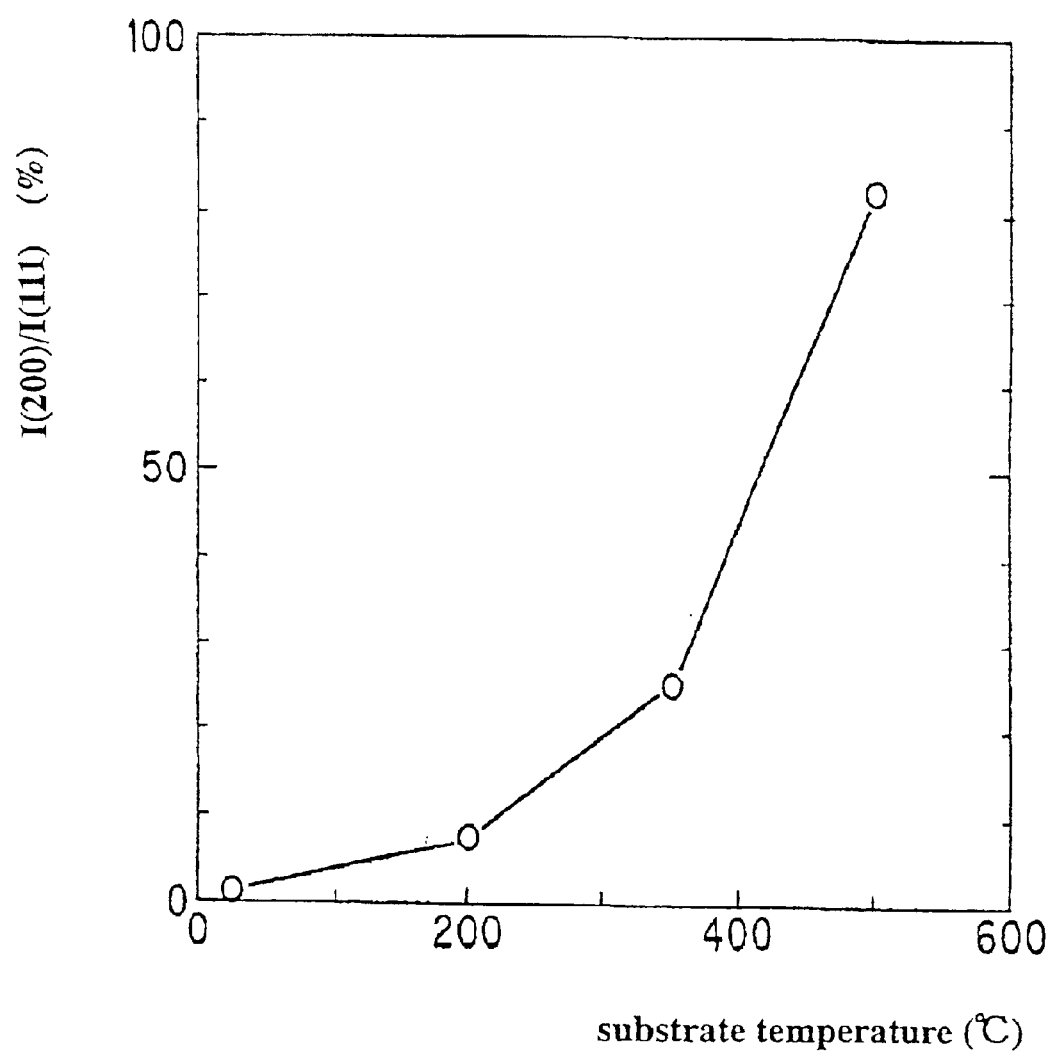
FIG. 4 is a diagram illustrative of variation in a ratio in X-ray diffraction spectrum intensity of (200)-face to (111)-face of a titanium nitride film deposited by a collimator sputtering method over substrate temperature of the collimator sputtering method, wherein the titanium nitride film is deposited on a silicon dioxide film so that the titanium nitride film has a thickness of 100 nanometers in a first embodiment in accordance with the present invention.

FIG. 4 is a diagram illustrative of variation in a ratio in X-ray diffraction spectrum intensity of (200)-face to (111)-face of a titanium nitride film deposited by a collimator sputtering method over substrate temperature of the collimator sputtering method, wherein the titanium nitride film is deposited on a silicon dioxide film so that the titanium nitride film has a thickness of 100 nanometers. The collimator sputtering method is carried out under a pressure of 3 mTorr. The ratio in X-ray diffraction spectrum intensity of (200)-face to (111)-face of the titanium nitride film represents a ratio in orientation of (200)-face to (111)-face of the titanium nitride film. The X-ray diffraction spectrum intensity was obtained by an X-ray θ-θ2 scanning. As the ratio in orientation of (200)-face to (111)-face of the titanium nitride film is increased, then a barrier property or a barrier capability of the titanium nitride film is also increased. As the substrate temperature of the collimator sputtering method for deposition of the titanium nitride film is increased, then the ratio in orientation of (200)-face to (111)-face of the titanium nitride film is simply increased. As the substrate temperature of the collimator sputtering method for deposition of the titanium nitride film is increased to about 200° C., then the ratio in orientation of (200)-face to (111)-face of the titanium nitride film is gradually increased. As the substrate temperature of the collimator sputtering method for deposition of the titanium nitride film is increased from about 200° C. to about 380° C., then the ratio in orientation of (200)-face to (111)-face of the titanium nitride film is more largely increased. As the substrate temperature of the collimator sputtering method for deposition of the titanium nitride film is increased from about 380° C. to about 500° C., then the ratio in orientation of (200)-face to (111)-face of the titanium nitride film is rapidly increased. The increasing rate of the ratio in orientation of (200)-face to (111)-face of the titanium nitride film is simply increased by increasing the substrate temperature. As the substrate temperature of the collimator sputtering method for deposition of the titanium nitride film is about 400° C., then the ratio in orientation of (200)-face to (111)-face of the titanium nitride film is about 50%. In order to obtain the titanium nitride film mainly oriented in (200)-face, it is required that the substrate temperature is not less than 450° C. under the low pressure of 3 mTorr. In order to obtain the titanium nitride film mostly oriented in (200)-face, it is required that the substrate temperature is not less than 500° C. under the low pressure of 3 mTorr.

Figure 5:
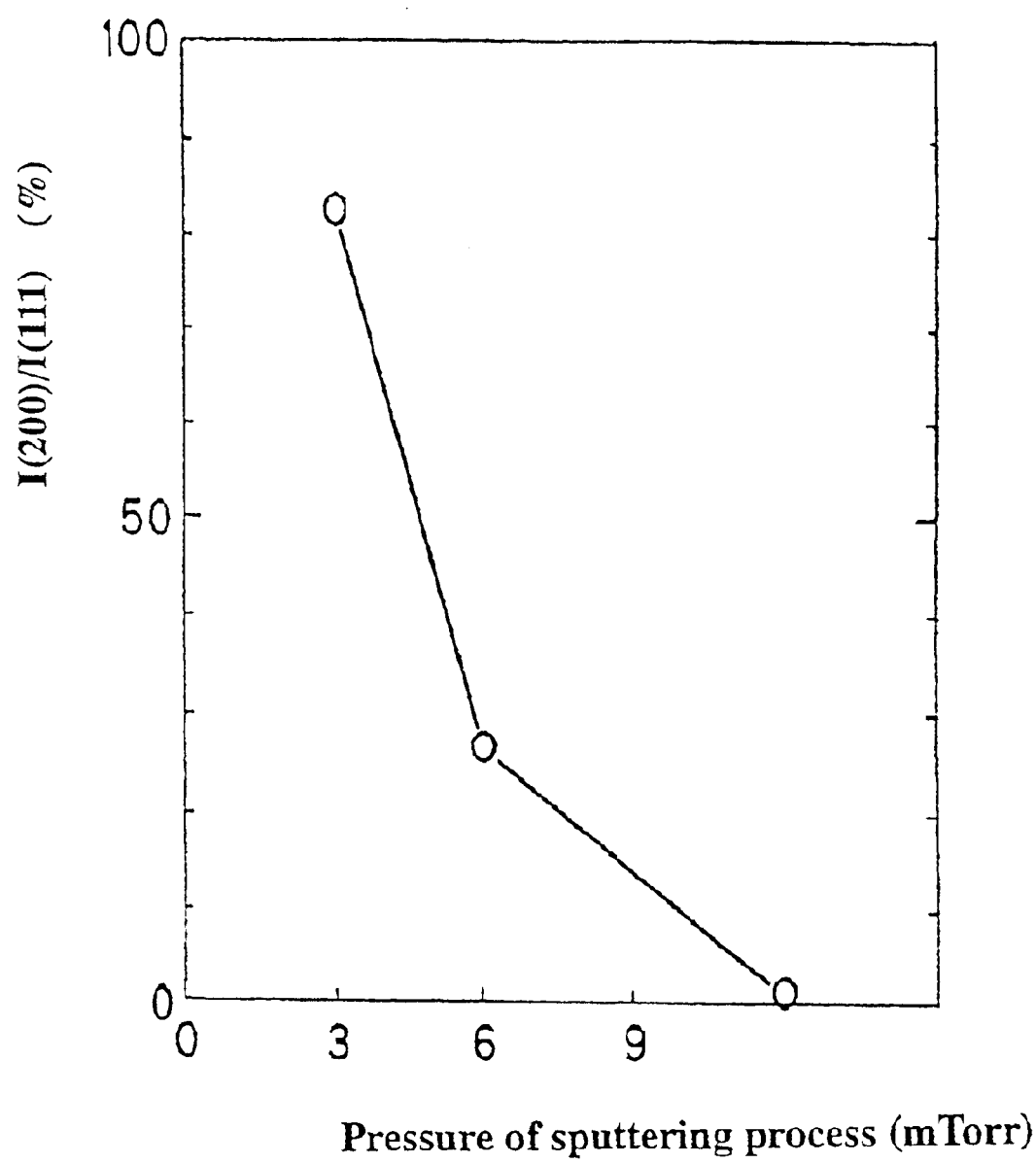
FIG. 5 is a diagram illustrative of variation in a ratio in X-ray diffraction spectrum intensity of (200)-face to (111)-face of a titanium nitride film deposited by a collimator sputtering method over pressure of the collimator sputtering method, wherein the titanium nitride film is deposited on a silicon dioxide film so that the titanium nitride film has a thickness of 100 nanometers in a first embodiment in accordance with the present invention.

FIG. 5 is a diagram illustrative of variation in a ratio in X-ray diffraction spectrum intensity of (200)-face to (111)-face of a titanium nitride film deposited by a collimator sputtering method over pressure of the collimator sputtering method, wherein the titanium nitride film is deposited on a silicon dioxide film so that the titanium nitride film has a thickness of 100 nanometers. The collimator sputtering method is carried out at a substrate temperature of 500° C. The ratio in X-ray diffraction spectrum intensity of (200)-face to (111)-face of the titanium nitride film represents a ratio in orientation of (200)-face to (111)-face of the titanium nitride film. The X-ray diffraction spectrum intensity was obtained by the X-ray θ-θ2 scanning. As the ratio in orientation of (200)-face to (111)-face of the titanium nitride film is increased, then a barrier property or a barrier capability of the titanium nitride film is also increased. As the pressure of the collimator sputtering method for deposition of the titanium nitride film is increased, then the ratio in orientation of (200)-face to (111)-face of the titanium nitride film is simply decreased. As the pressure of the collimator sputtering method for deposition of the titanium nitride film is increased from 3 mTorr to 6 mTorr, then the ratio in orientation of (200)-face to (111)-face of the titanium nitride film is rapidly decreased. As the pressure of the collimator sputtering method for deposition of the titanium nitride film is increased from 6 mTorr to 12 mTorr, then the ratio in orientation of (200)-face to (111)-face of the titanium nitride film is largely decreased. The decreasing rate of the ratio in orientation of (200)-face to (111)-face of the titanium nitride film is simply increased by increasing the substrate temperature. As the pressure of the collimator sputtering method for deposition of the titanium nitride film is 3 mTorr, then the ratio in orientation of (200)-face to (111)-face of the titanium nitride film is over 80%. As the pressure of the collimator sputtering method for deposition of the titanium nitride film is 6 mTorr, then the ratio in orientation of (200)-face to (111)-face of the titanium nitride film is below 30%. As the pressure of the collimator sputtering method for deposition of the titanium nitride film is 12 mTorr, then the ratio in orientation of (200)-face to (111)-face of the titanium nitride film is almost 0%. In order to obtain the titanium nitride film mainly oriented in (200)-face, it is required that the pressure of the collimator sputtering is not more than 3 mTorr.

If the collimator sputtering method is carried out under a high pressure of not less than 10 mTorr at the normal substrate temperature in the range of 200–300° C., it is possible to reduce the compressive stress of the titanium nitride film deposited by the collimator sputtering method, whereby no micro crack might be formed in the titanium nitride film upon the heat treatment such as the lamp anneal. However, the titanium nitride film is mainly oriented in (111)-face, whereby barrier property of the titanium nitride film is deteriorated to allow tungsten hexa-fluoride used for deposition of the tungsten film to be reacted with titanium nitride of the titanium nitride film and titanium of the titanium film, resulting in an increase in the contact resistance of the contact plug and a possible breaking of the p-n junction.

If, in accordance with the present invention, the collimator sputtering method is carried out under a low pressure of, for example, not less than 3 mTorr at the high substrate temperature of not less than 450° C., for example, 500° C., it is possible to reduce the compressive stress to not higher than $5 \times 10^9$ dyne/cm$^2$ of the titanium nitride film deposited by the collimator sputtering method, whereby no micro crack is formed in the titanium nitride film upon the heat treatment such as the lamp anneal. Further, the titanium nitride film is mainly oriented in (200)-face, whereby barrier property of the titanium nitride film is improved to cause tungsten hexa-fluoride used for deposition of the tungsten film to be unreacted with titanium nitride of the titanium nitride film and titanium of the titanium film, resulting in no increase in the contact resistance of the contact plug and no possible breaking of the p-n junction.

Contact resistances of the contact plug with the titanium silicide film in the upper region of n-type and p-type silicon substrates were measured in order to evaluate barrier properties of titanium nitride films deposited by the collimator sputtering method at various substrate temperatures and under various pressures, wherein the contact hole has a diameter of 0.3 micrometers and a depth of 1.8 micrometers as well as an aspect ratio of 6. The titanium film has a thickness of 50 nanometers. The titanium nitride film has a thickness of 100 nanometers. The collimator sputtering method is carried out by use of a collimator plate having an aspect ratio of 1.5. The other conditions are the same as described above with reference to FIGS. 2A through 2D.

When the collimator sputtering method is carried out at the substrate temperature of 50° C. under the pressure of 3 mTorr to deposit the titanium nitride film for forming the contact plug on the n-type silicon substrate, then a measured contact resistance of the contact plug in the contact hole is variable in the range of 800 Ω to $1 \times 10^5$ Ω. The measured contact resistance has a large variation up to an extremely high resistance of $1 \times 10^5$ Ω.

When the collimator sputtering method is carried out at the substrate temperature of 50° C. under the pressure of 3 mTorr to deposit the titanium nitride film for forming the contact plug on the p-type silicon substrate, then a measured contact resistance of the contact plug in the contact hole is variable in the range of 1000 Ω to $1 \times 10^5$ Ω. The measured contact resistance has a large variation up to an extremely high resistance of $1 \times 10^5$ Ω.

When the collimator sputtering method is carried out at the substrate temperature of 200° C. under the pressure of 3 mTorr to deposit the titanium nitride film for forming the contact plug on the n-type silicon substrate, then a measured contact resistance of the contact plug in the contact hole is variable in the range of 550 Ω to $1 \times 10^5$ Ω. The measured contact resistance has a large variation up to an extremely high resistance of $1 \times 10^5$ Ω.

When the collimator sputtering method is carried out at the substrate temperature of 200° C. under the pressure of 3 mTorr to deposit the titanium nitride film for forming the contact plug on the p-type silicon substrate, then a measured contact resistance of the contact plug in the contact hole is variable in the range of 700 Ω to $1 \times 10^5$ Ω. The measured contact resistance has a large variation up to an extremely high resistance of $1 \times 10^5$ Ω.

When the collimator sputtering method is carried out at the substrate temperature of 400° C. under the pressure of 3 mTorr to deposit the titanium nitride film for forming the contact plug on the n-type silicon substrate, then a measured contact resistance of the contact plug in the contact hole is variable in the range of 220 Ω to 900 Ω. The measured contact resistance still has a small variation and is suppressed low.

When the collimator sputtering method is carried out at the substrate temperature of 400° C. under the pressure of 3 mTorr to deposit the titanium nitride film for forming the contact plug on the p-type silicon substrate, then a measured contact resistance of the contact plug in the contact hole is variable in the range of 800 Ω to $1 \times 10^4$ Ω. The measured contact resistance has a large variation up to an extremely high resistance of $1 \times 10^4$ Ω.

When the collimator sputtering method is carried out at the substrate temperature of 500° C. under the pressure of 3 mTorr to deposit the titanium nitride film for forming the contact plug on the n-type silicon substrate, then a measured contact resistance of the contact plug in the contact hole is variable in the range of 220 Ω to 400 Ω. The measured contact resistance still has an extremely small variation and is suppressed very low.

When the collimator sputtering method is carried out at the substrate temperature of 500° C. under the pressure of 3 mTorr to deposit the titanium nitride film for forming the contact plug on the p-type silicon substrate, then a measured contact resistance of the contact plug in the contact hole is variable in the range of 500 Ω to 1100 Ω. The measured contact resistance still has a small variation and is suppressed low.

When the collimator sputtering method is carried out at the substrate temperature of 500° C. under the high pressure of 12 mTorr to deposit the titanium nitride film for forming the contact plug on the n-type silicon substrate, then a measured contact resistance of the contact plug in the contact hole is variable in the range of 350 Ω to $1 \times 10^5$ Ω. The measured contact resistance has a large variation up to an extremely high resistance of $1 \times 10^5$ Ω.

When the collimator sputtering method is carried out at the substrate temperature of 500° C. under the high pressure of 12 mTorr to deposit the titanium nitride film for forming the contact plug on the p-type silicon substrate, then a measured contact resistance of the contact plug in the contact hole is variable in the range of 700 Ω to $1 \times 10^5$ Ω. The measured contact resistance has a large variation up to an extremely high resistance of $1 \times 10^5$ Ω.

In order to obtain both the 80% high ratio in orientation of (200)-face to (111)-face for a high barrier property of the titanium nitride film and the low compressive stress of not higher than $5 \times 10^9$ dyne/cm$^2$ of the titanium nitride film for suppressing the formation of the crack in the titanium nitride film, it is necessary that the collimator sputtering method for deposition of the titanium nitride film is carried out at the substrate temperature of not higher than 450° C. under a pressure of 3 mTorr.

Second Embodiment:

A second embodiment according to the present invention will be described in detail with reference to FIGS. 6A through 6D which are fragmentary cross sectional elevation views illustrative of a novel method of forming an improved contact plug in a contact hole in an inter-layer insulator on a silicon substrate, wherein a bottom of the contact hole is in contact with a titanium silicide layer.

Figure 6A:
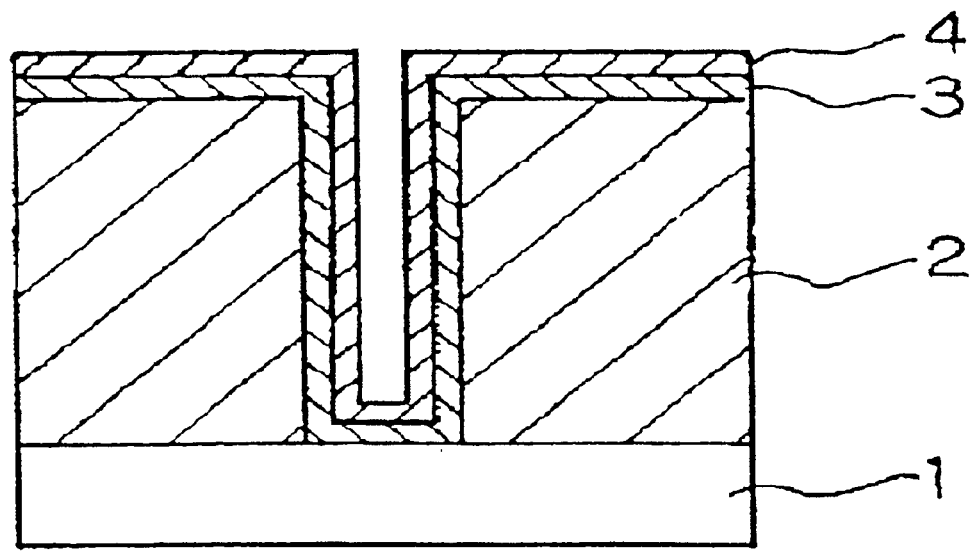
FIGS. 6A through 6D are fragmentary cross sectional elevation views illustrative of a novel method of forming an improved contact plug in a contact hole in an inter-layer insulator on a silicon substrate, wherein a bottom of the contact hole is in contact with a titanium silicide layer in a second embodiment in accordance with the present invention.
Figure 6B:
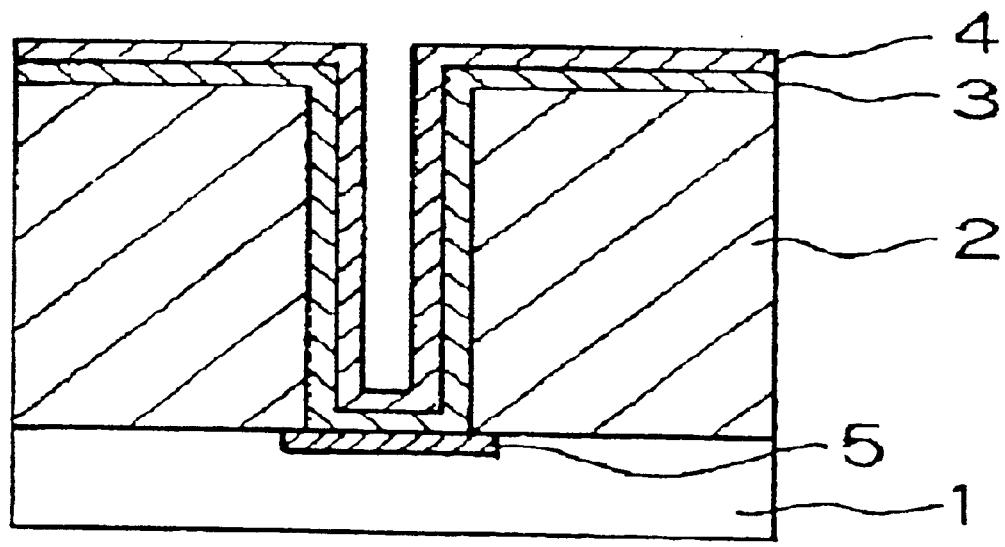

With reference to FIG. 6A, semiconductor devices are formed in a silicon substrate 1. A boro-phospho-silicate glass film 2 as an inter-layer insulator is deposited by a chemical vapor deposition method on a surface of the silicon substrate 1. A contact hole is formed in the inter-layer insulator 2 by use of a photo-lithography and a subsequent dry etching process so that the contact hole reaches a surface of the silicon substrate 1, whereby a part of the surface of the silicon substrate 1 is shown through the contact hole. The contact hole has a diameter of not larger than 0.35 micrometers.

A long distance sputtering method is carried out to deposit a titanium film 3 on the top surface of the inter-layer insulator 2 and on vertical side walls and a bottom of the contact hole, wherein the titanium film 3 has a thickness in the range of 50 nanometers. Subsequently, a titanium nitride film 4 is then deposited by the long distance sputtering method on the titanium film 3, wherein the titanium nitride film 4 has a thickness of 100 nanometers. The first long distance sputtering method for depositing the titanium film 3 is carried out by sputtering a titanium target with argon gas at a distance between a target and the substrate in the range of 200–500 millimeters under a low pressure in the range of 0.3–0.5 mTorr and at a substrate temperature in the range of about 150–400° C. The second long distance sputtering method for depositing the titanium nitride film 4 is carried out by sputtering a titanium nitride target with a nitrogen-argon mixture gas at a distance between a target and the substrate in the range of 200–350 millimeters under a low pressure in the range of 0.4–0.7 mTorr and at a substrate temperature of not less than 450° C., for example, 500° C. A nitrogen flow rate is in the range of 70% to 90% of a total flow rate of the gases.

Subsequently, a lamp anneal is carried out in a nitrogen atmosphere at a temperature in the range of 650–720° C. for 10–60 seconds, wherein a temperature rising rate is in the range of 50–100° C./seconds, whereby a titanium silicidation reaction of titanium in the titanium film 3 with silicon in the silicon substrate 1 is cased to form a titanium silicide film 5 on an interface between the titanium film 3 and the silicon substrate 1, thereby reducing a contact resistance of the titanium film 3 with the silicon substrate 1. This lamp anneal further causes a nitratio reaction of unreacted titanium with nitrogen in the titanium nitride film 4, thereby increasing a barrier property of the titanium nitride film 4.

Figure 6C:
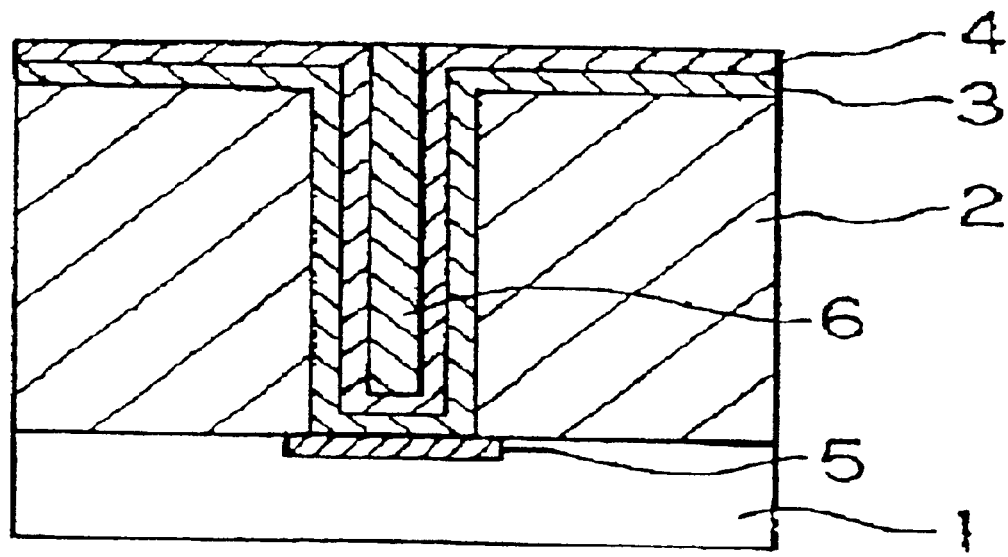

With reference to FIG. 6C, a low pressure chemical vapor deposition method is carried out by reducing tungsten hexafluoride with hydrogen to deposit a tungsten film 6 on the titanium nitride film 4 so that the tungsten film 6 has a thickness in the range of 400–600 nanometers. The surface of the CVD-deposited tungsten film 6 is then subjected to an etch-back process with use of sulfur hexafluoride to etch the CVD-deposited tungsten film 6 except within the contact hole, whereby a tungsten contact plug 6 is formed in the contact hole.

Figure 6D:
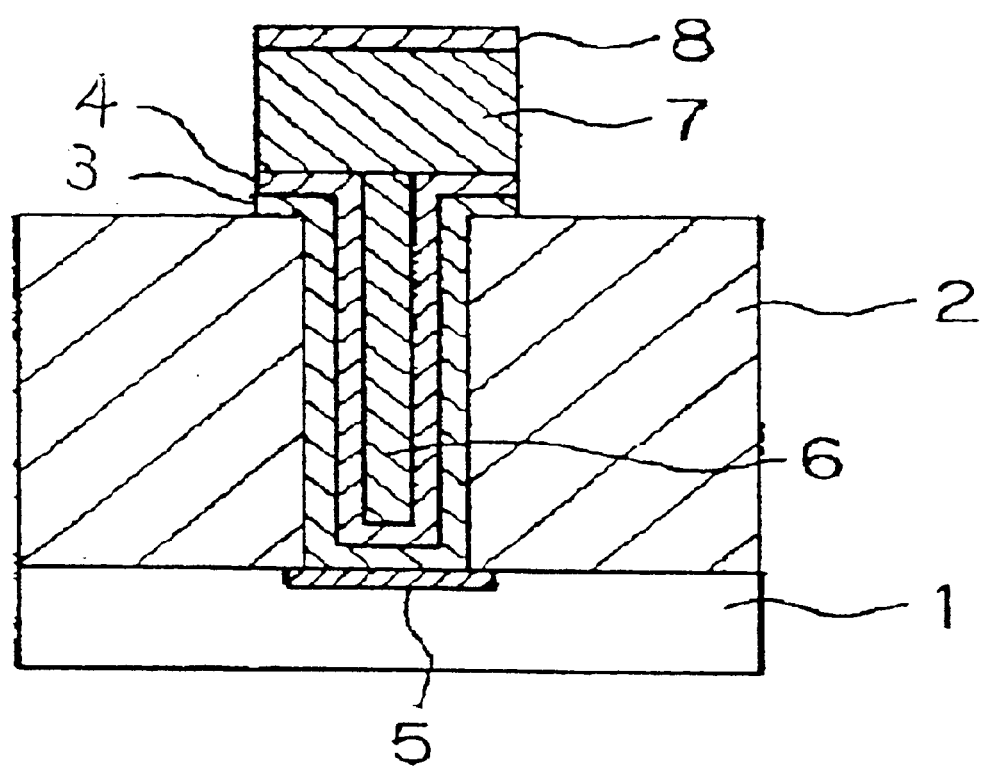

With reference to FIG. 6D, an aluminum alloy film 7 is deposited by a sputtering method on the titanium nitride film 4 and over the inter-layer insulator 2 and on the top of the contact plug in the contact hole. Further, a titanium nitride film 8 is deposited by a subsequent sputtering method on the aluminum alloy film 7 to form laminations of the aluminum alloy film 7 and the titanium nitride film 8. The laminations of the aluminum alloy film 7 and the titanium nitride film 8 are then patterned by a photo-lithography and a subsequent dry etching process thereby to form an interconnection over the inter-layer insulator 2, wherein the interconnection is in contact with the top of the contact plug in the contact hole so that the interconnection is electrically connected through the contact plug in the contact hole to the semiconductor device in the surface of the silicon substrate 1.

The titanium nitride film deposited by a long distance sputtering method before the heat treatment or the lamp anneal has a compressive stress. By the heat treatment or the lamp anneal, the compressive stress of the titanium nitride film is changed into a tensile stress. The long distance sputtering method is carried out under a pressure of 3 mTorr for depositions of the titanium film having a thickness of 50 nanometers and the titanium nitride film having a thickness of 100 nanometers. The compressive and tensile stresses of the titanium nitride film were measured from a degree of bending of the titanium nitride film. The lamp anneal is carried out at a temperature of 700° C. for 30 seconds at a temperature rising rate of 100° C./seconds.

As the substrate temperature for the long distance sputtering method for deposition of the titanium nitride film is increased, then the compressive stress of the deposited titanium nitride film is also simply decreased as similarly to when the collimator sputtering method was carried out. As the substrate temperature is increased from 50° C. to 350° C., then the compressive stress of the deposited titanium nitride film is gradually decreased. As the substrate temperature is increased from 350° C. to 500° C., then the compressive stress of the deposited titanium nitride film is rapidly decreased. When the substrate temperature is 400° C., the compressive stress of the deposited titanium nitride film is about $1 \times 10^{10}$ dyne/cm$^2$. When the substrate temperature is 450° C., the compressive stress of the deposited titanium nitride film is about $5 \times 10^9$ dyne/cm$^2$. When the substrate temperature is 500° C., the compressive stress of the deposited titanium nitride film is about $3 \times 10^9$ dyne/cm$^2$.

As the substrate temperature for the long distance sputtering method for deposition of the titanium nitride film is increased, then the tensile stress of the deposited titanium nitride film is also simply decreased. As the substrate temperature is increased from 50° C. to 350° C., then the compressive stress of the deposited titanium nitride film is gradually decreased. As the substrate temperature is increased from 350° C. to 500° C., then the tensile stress of the deposited titanium nitride film is rapidly decreased. When the substrate temperature is 400° C., the tensile stress of the deposited titanium nitride film is about $1.5 \times 10^{10}$ dyne/cm$^2$. When the substrate temperature is 450° C., the tensile stress of the deposited titanium nitride film is about $3 \times 10^9$ dyne/cm$^2$. When the substrate temperature is 500° C., the tensile stress of the deposited titanium nitride film is about $2 \times 10^9$ dyne/cm$^2$.

Consequently, as the substrate temperature for the long distance sputtering method for deposition of the titanium nitride film is increased, then a difference between the compressive stress and the tensile stress of the deposited titanium nitride film is also simply decreased. As the substrate temperature is increased from 50° C. to 350° C., then a difference between the compressive stress and the tensile stress of the deposited titanium nitride film is gradually decreased. As the substrate temperature is increased from 350° C. to 500° C., then a difference between the compressive stress and the tensile stress of the deposited titanium nitride film is rapidly decreased. When the substrate temperature is 400° C., the compressive stress of about $1 \times 10^{10}$ dyne/cm$^2$ is changed into the tensile stress of about $1.5 \times 10^{10}$ dyne/cm$^2$. When the substrate temperature is 450° C., the compressive stress of about $5\times10^9$ dyne/cm$^2$ is changed into the tensile stress of about $3\times10^9$ dyne/cm$^2$. When the substrate temperature is 500° C., the compressive stress of about $3\times10^9$ dyne/cm$^2$ is changed into the tensile stress of about $2\times10^9$ dyne/cm$^2$. A large difference between the compressive stress and the tensile stress of the titanium nitride film causes a large deformation of the titanium nitride film. This large deformation of the titanium nitride film results in a high possibility of cracking the titanium nitride film. For those reason, in order to reduce the possibility of cracking the titanium nitride film, it is necessary to realize a possible reduction in a difference between the compressive stress and the tensile stress of the titanium nitride film. By use of a four-terminal sheet resistance measuring method is applied to measure the sheet resistance. When the titanium nitride film having the compressive stress of not more than about $5\times10^9$ dyne/cm$^2$ is subjected to the lamp anneal at a temperature of 700° C. for 30 seconds at a temperature rising rate of 100° C./second so that the compressive stress of not more than about $5\times10^9$ dyne/cm$^2$ is changed into the tensile stress of not more about $3\times10^9$ dyne/cm$^2$, then no extremely high sheet resistance could be measured throughout the titanium nitride film. No crack could be observed by an electron microscope throughout the titanium nitride film after the lamp anneal was carried out. When the titanium nitride film having the compressive stress of more than about $5\times10^9$ dyne/cm$^2$ is subjected to the lamp anneal at a temperature of 700° C. for 30 seconds at a temperature rising rate of 100° C./second so that the compressive stress of more than about $5\times10^9$ dyne/cm$^2$ is changed into the tensile stress of more than about $3\times10^9$ dyne/cm$^2$, then extremely high sheet resistance could be measured at plural points of the titanium nitride film. Micro cracks could be observed by the electron microscope at the extremely high sheet resistance points of the titanium nitride film after the lamp anneal was carried out. This shows that the micro cracks were formed by the lamp anneal.

Consequently, in order to avoid any formation of the cracks such as micro cracks in the titanium nitride film during the heat treatment such as the lamp anneal, it is necessary that the titanium nitride film is deposited by the long distance sputtering method at the substrate temperature of not less than 450° C., so that the deposited titanium nitride film has the low compressive stress of not more than about $5\times10^9$ dyne/cm$^2$, whereby the low compressive stress of not more than about $5\times10^9$ dyne/cm$^2$ is changed by the heat treatment such as the lamp anneal into the low tensile stress of more than about $3\times10^9$ dyne/cm$^2$, resulting in no crack nor micro crack being formed throughout the titanium nitride film. It is particularly preferable that the titanium nitride film is deposited by the long distance sputtering method at the substrate temperature of not less than 500° C., so that the deposited titanium nitride film has the low compressive stress of not more than about $3\times10^9$ dyne/cm$^2$, whereby the low compressive stress of not more than about $3\times10^9$ dyne/cm$^2$ is changed by the heat treatment such as the lamp anneal into the low tensile stress of more than about $2\times10^9$ dyne/cm$^2$, resulting in no crack nor micro crack being formed throughout the titanium nitride film.

Measurement was made to the ratio in X-ray diffraction spectrum intensity of (200)-face to (111)-face of a titanium nitride film deposited by the long distance sputtering method over substrate temperature of the long distance sputtering method, wherein the titanium nitride film is deposited on a silicon dioxide film so that the titanium nitride film has a thickness of 100 nanometers. The long distance sputtering method is carried out under a pressure of 0.4–0.7 mTorr. The ratio in X-ray diffraction spectrum intensity of (200)-face to (111)-face of the titanium nitride film represents a ratio in orientation of (200)-face to (111)-face of the titanium nitride film. As the ratio in orientation of (200)-face to (111)-face of the titanium nitride film is increased, then a barrier property or a barrier capability of the titanium nitride film is also increased. As the substrate temperature of the long distance sputtering method for deposition of the titanium nitride film is increased, then the ratio in orientation of (200)-face to (111)-face of the titanium nitride film is simply increased. As the substrate temperature of the long distance sputtering method for deposition of the titanium nitride film is increased to about 200° C., then the ratio in orientation of (200)-face to (111)-face of the titanium nitride film is gradually increased. As the substrate temperature of the long distance sputtering method for deposition of the titanium nitride film is increased from about 200° C. to about 380° C., then the ratio in orientation of (200)-face to (111)-face of the titanium nitride film is more largely increased. As the substrate temperature of the long distance sputtering method for deposition of the titanium nitride film is increased from about 380° C. to about 500° C., then the ratio in orientation of (200)-face to (111)-face of the titanium nitride film is rapidly increased. The increasing rate of the ratio in orientation of (200)-face to (111)-face of the titanium nitride film is simply increased by increasing the substrate temperature. Normally, the long distance sputtering method is carried out under a low pressure of not more than 1 mTorr, whereby the deposited titanium nitride film is likely to be oriented mostly in (200)-face. When the substrate temperature is 500° C., then the ratio in orientation of (200)-face to (111)-face of the titanium nitride film is over 80%.

In order to obtain both the 80% high ratio in orientation of (200)-face to (111)-face for a high barrier property of the titanium nitride film and the low compressive stress of not higher than $5\times10^9$ dyne/cm$^2$ of the titanium nitride film for suppressing the formation of the crack in the titanium nitride film, it is necessary that the long distance sputtering method for deposition of the titanium nitride film is carried out at the substrate temperature of not higher than 450° C. under a pressure of not higher than 1 mTorr.

Whereas modifications of the present invention will be apparent to a person having ordinary skill in the art, to which the invention pertains, it is to be understood that embodiments as shown and described by way of illustratios are by no means intended to be considered in a limiting sense. Accordingly, it is to be intended to cover by claims all modifications which fall within the spirit and scope of the present invention.

What is claimed is:

1. A multilayer structure on a bottom of a contact hole, said multilayer structure comprising a titanium film on a silicon region and a titanium nitride film on said titanium film, wherein said titanium nitride film has a compressive stress of not higher than $3\times10^9$ dyne/cm$^2$ so that said titanium film has such a high stability as preventing any crack upon changing said compressive stress to a tensile stress by a heat treatment.

2. The multilayer structure as claimed in claim 1, wherein said titanium nitride film is mainly oriented in a (200)-face.

3. The multilayer structure as claimed in claim 1, wherein said contact hole has an aspect ratio of not less than 4.

4. The multilayer structure as claimed in claim 3, wherein said contact hole has an aspect ratio of not less than 5.

5. A contact plug structure in a contact hole in an inter-layer insulator on a silicon substrate, said contact plug structure comprising:

a titanium film on a bottom and a side wall of said contact hole;

a titanium nitride film on said titanium film;

a metal plug on said titanium nitride film so that said metal plug buries said contact hole; and a titanium silicide layer in a surface region of said silicon substrate and in contact with a bottom of said contact hole, wherein said titanium nitride film free of any crack and has a tensile stress of not higher than $2 \times 10^9$ dyne/cm$^2$.

6. The contact plug structure as claimed in claim 5, wherein said titanium nitride film is mainly oriented in a (200)-face.

7. The contact plug structure as claimed in claim 5, wherein said contact hole has an aspect ratio of not less than 4.

8. The contact plug structure as claimed in claim 7, wherein said contact hole has an aspect ratio of not less than 5.

* * * * *